(12) United States Patent
Nagai et al.

(10) Patent No.: US 8,748,853 B2
(45) Date of Patent: Jun. 10, 2014

(54) CHAMBER APPARATUS

(75) Inventors: Shinji Nagai, Hiratsuka (JP); Osamu Wakabayashi, Hiratsuka (JP); Yutaka Shiraishi, Oyama (JP); Junichi Fujimoto, Hiratsuka (JP)

(73) Assignee: Gigaphoton Inc., Tochigi (JP)

( * ) Notice: Subject to any disclaimer, the term of this patent is extended or adjusted under 35 U.S.C. 154(b) by 0 days.

(21) Appl. No.: 13/494,442

(22) Filed: Jun. 12, 2012

(65) Prior Publication Data

US 2012/0248343 A1 Oct. 4, 2012

Related U.S. Application Data

(63) Continuation-in-part of application No. 13/070,735, filed on Mar. 24, 2011.

(30) Foreign Application Priority Data

| Jun. 20, 2011 | (JP) | ................................. 2011-136775 |
| Sep. 28, 2011 | (JP) | ................................. 2011-213266 |
| May 9, 2012 | (JP) | ................................. 2012-107377 |

(51) Int. Cl.
*H05G 2/00* (2006.01)

(52) U.S. Cl.
CPC ..................................... *H05G 2/008* (2013.01)
USPC .................................................... 250/504 R

(58) Field of Classification Search
USPC .............................................. 250/489, 504 R
See application file for complete search history.

(56) References Cited

U.S. PATENT DOCUMENTS

| 6,734,436 B2 | 5/2004 | Faris et al. | |
| 7,476,886 B2 * | 1/2009 | Bykanov et al. | .......... 250/504 R |
| 8,067,756 B2 * | 11/2011 | Ueno et al. | ................ 250/504 R |
| 2009/0224182 A1 | 9/2009 | McGeoch | |
| 2009/0272919 A1 * | 11/2009 | Abe et al. | .................. 250/504 R |
| 2010/0019173 A1 * | 1/2010 | Someya et al. | ............ 250/496.1 |

FOREIGN PATENT DOCUMENTS

JP 2007-266234 10/2007

OTHER PUBLICATIONS

US Office Action issued in U.S. Appl. No. 13/070,735 mailed Dec. 20, 2012.
United States Office Action issued in U.S. Appl. No. 13/070,735 mailed Jun. 18, 2013.
Ostrovskaya et al., "Thermal Treatment Effect on the Tin Melt Adhesion to the Surface of Amorphous Silicon Carbide Films", 2006, Physics and Chemistry of Solid State, V. 7, No. 3, pp. 555-559.

* cited by examiner

*Primary Examiner* — Jack Berman
*Assistant Examiner* — Eliza Osenbaugh-Stewart
(74) *Attorney, Agent, or Firm* — McDermott Will & Emery LLP

(57) ABSTRACT

A chamber apparatus for operating with a laser apparatus includes a chamber, a target supply unit, a collection unit and a collection container. The chamber includes an inlet through which a laser beam from the laser apparatus enters the chamber. The target supply unit is configured to supply a target material to a predetermined region inside the chamber. The collection unit includes a debris entering surface so that debris generated when the target material is irradiated with the laser beam enters the debris entering surface. The debris entering surface is inclined with respect to a direction in which the debris enters the debris entering surface. The collection container collects the debris flowing out of the collection unit.

8 Claims, 18 Drawing Sheets

CHAMBER APPARATUS

CROSS-REFERENCE TO RELATED APPLICATIONS

The present application is a continuation-in-part of U.S. patent application Ser. No. 13/070,735 filed Mar. 24, 2011, which claims priority from Japanese Patent Application No. 2010-076254 filed Mar. 29, 2010, Japanese Patent Application No. 2010-288901 filed Dec. 24, 2010, and Japanese Patent Application No. 2011-012096 filed Jan. 24, 2011. The present application further claims priority from Japanese Patent Application No. 2011-136775 filed Jun. 20, 2011, Japanese Patent Application No. 2011-213266 filed Sep. 28, 2011, and Japanese Patent Application No. 2012-107377 filed May 9, 2012.

BACKGROUND

1. Technical Field

This disclosure relates to a chamber apparatus.

2. Related Art

In recent years, semiconductor production processes have become capable of producing semiconductor devices with increasingly fine feature sizes, as photolithography has been making rapid progress toward finer fabrication. In the next generation of semiconductor production processes, microfabrication with feature sizes at 60 nm to 45 nm, and further, microfabrication with feature sizes of 32 nm or less will be required. In order to meet the demand for microfabrication with feature sizes of 32 nm or less, for example, an exposure apparatus is needed in which a system for generating Extreme Ultraviolet (EUV) light at a wavelength of approximately 13 nm is combined with a reduced projection reflective optical system.

Three kinds of systems for generating EUV light are known in general, which include a Laser Produced Plasma (LPP) type system in which plasma is generated by irradiating a target material with a laser beam, a Discharge Produced Plasma (DPP) type system in which plasma is generated by electric discharge, and a Synchrotron Radiation (SR) type system in which orbital radiation is used.

SUMMARY

A chamber apparatus according to one aspect of this disclosure may operate with a laser apparatus and may include a chamber, a target supply, a collection unit and a collection container. The chamber may include an inlet through which a laser beam from the laser apparatus enters the chamber. The target supply unit may be configured to supply a target material to a predetermined region inside the chamber. The collection unit may include a debris entering surface so that debris generated when the target material is irradiated with the laser beam enters the debris entering surface. The debris entering surface may be inclined with respect to a direction in which the debris enters the debris entering surface. The collection container may be provided for collecting the debris flowing out of the collection unit.

A chamber apparatus according to another aspect of this disclosure may operate with a laser apparatus and may include a chamber, a target supply unit, a magnetic field generation unit, a collection unit and a temperature control unit. The chamber may include an inlet through which a laser beam from the laser apparatus enters the chamber. The target supply unit may be configured to supply a target material to a predetermined region inside the chamber. The magnetic field generation unit may be configured to generate a magnetic field across the predetermined region inside the chamber. The collection unit may be configured to collect debris traveling along the magnetic field. The debris is generated when the target material is irradiated with the laser beam. The temperature control unit may be configured to retain a temperature of at least a part of the collection unit within a predetermined temperature range. The temperature control unit may include a cooler configured to cool the collection unit, a heater configured to heat the collection unit, a temperature sensor configured to detect a temperature of the collection unit, and a controller configured to control at least one of the cooler and the heater based on the temperature detected by the temperature sensor.

BRIEF DESCRIPTION OF THE DRAWINGS

Hereinafter, selected embodiments of this disclosure will be described with reference to the accompanying drawings.

DETAILED DESCRIPTION

Figure 1:
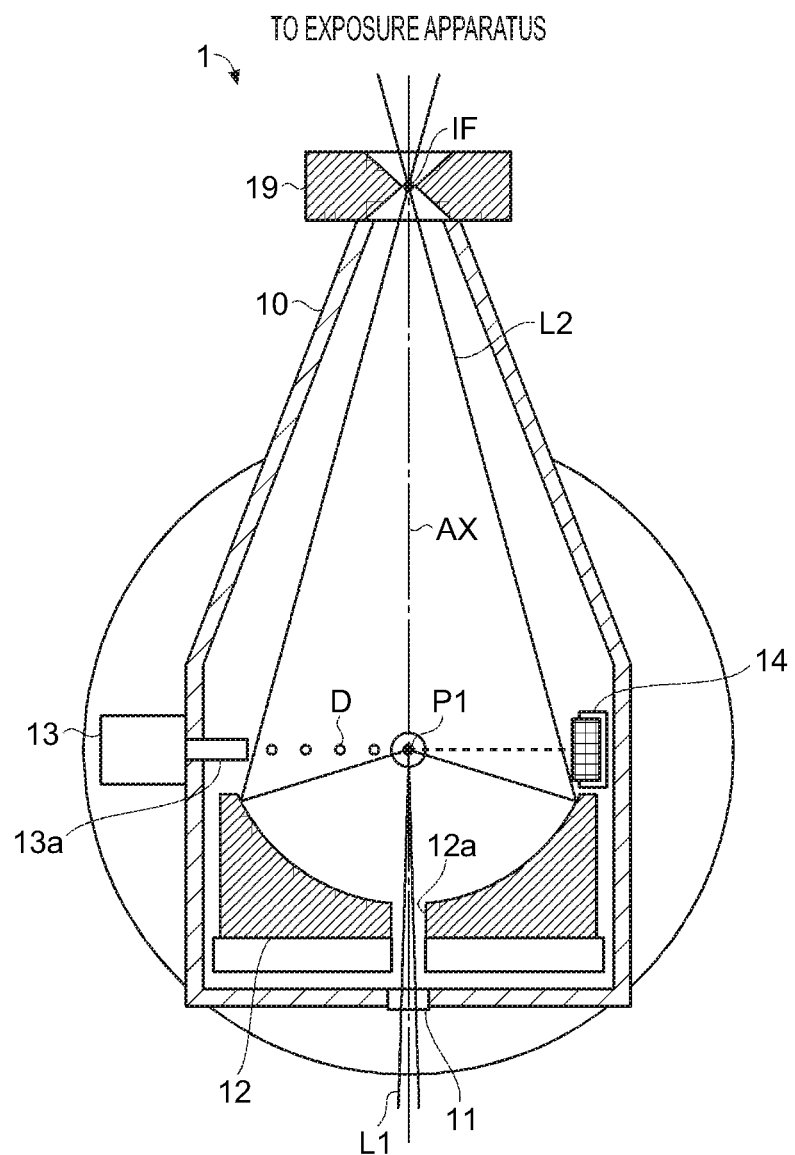
FIG. 1 is a sectional view schematically illustrating an example of the configuration of an EUV light generation apparatus according to a first embodiment of this disclosure.

Hereinafter, selected embodiments for implementing this disclosure will be described in detail with reference to the accompanying drawings. In the subsequent description, each drawing merely illustrates shape, size, and positional relationship schematically to the extent that enables the content of this disclosure to be understood. Thus, this disclosure is not limited to the shape, the size, and the positional relationship illustrated in each drawing. In order to show the configuration clearly, part of the hatching along a section may be omitted in the drawings. Further, numerical values indicated herein are merely examples of this disclosure; thus, this disclosure is not limited to the indicated numerical values.

First Embodiment

An EUV light generation apparatus according to a first embodiment will be described in detail with reference to the drawings. FIG. 1 is a sectional view schematically illustrating an example of the configuration of the EUV light generation apparatus according to the first embodiment. FIG. 1 is a section taken along a plane containing the axis (AX) of EUV light reflected by an EUV collector mirror.

As shown in FIG. 1, an EUV light generation apparatus 1 may include a chamber 10 that defines a space in which EUV light L2 is generated. A target supply unit may be provided on the chamber 10. The target supply unit may be a droplet generator 13. Tin (Sn) serving as a target material for generating the EUV light L2 may be stored in the droplet generator 13 in a molten state. The droplet generator 13 may include a nozzle 13a provided at a leading end thereof. The droplet generator 13 may preferably be positioned such that the tip of the nozzle 13a is oriented toward a predetermined position in a plasma generation region P1 inside the chamber 10. A tin droplet D may be outputted through the tip of the nozzle 13a toward the plasma generation region P1. The droplet generator 13 may be configured to output molten tin in the form of the droplets D through the tip of the nozzle 13a by using the internal pressure. However, this disclosure is not limited thereto. For example, a so-called electrostatic pull-out type droplet generator or a so-called electrostatic pull-out acceleration type droplet generator may also be used as the droplet generator 13. In the electrostatic pull-out type droplet generator, an electrode may be provided to face the tip of the nozzle 13a in order to pull out molten tin by the electrostatic force. In the electrostatic pull-out acceleration type droplet generator, another electrode may be provided in order to accelerate the pulled-out droplet D by the electrostatic force.

The droplet D supplied to the plasma generation region P1 may be irradiated with a laser beam L1 outputted from a laser apparatus through an inlet provided in the chamber 10. The laser apparatus may be an external driver laser (not separately shown). The inlet may be a window 11. The laser beam L1 may travel toward the plasma generation region P1 through a through-hole 12a formed at the center of an EUV collector mirror 12. The laser beam L1 may preferably be outputted from the driver laser at such a timing that the droplet D is irradiated with the laser beam L1 when the droplet D arrives in the plasma generation region P1. Upon being irradiated with the laser beam L1, the droplet D may be turned into plasma in the plasma generation region P1. Light including the EUV light L2 at a predetermined wavelength may be emitted from the droplet D, which has been turned into plasma, when the plasma is deexcited. The EUV collector mirror 12 configured to selectively reflect the EUV light L2 among the light emitted in the plasma generation region P1 may be provided inside the chamber 10. The EUV light L2 reflected by the EUV collector mirror 12 may be focused at a predetermined position (intermediate focus IF) inside an exposure apparatus connecting part 19 serving to connect the EUV light generation apparatus 1 to an exposure apparatus (not separately shown), and may subsequently be guided into the exposure apparatus.

A target collection unit 14 may be provided in the chamber 10 to collect the droplets D that have passed through the plasma generation region P1 or a part of the droplet D which has not been turned into plasma. The target collection unit 14 may be provided, for example, on the extension of a line connecting the tip of the nozzle 13a and the plasma generation region P1. When the trajectory of the droplet D is curved, the target collection unit 14 may be provided on the extension of the curved trajectory.

Figure 2:
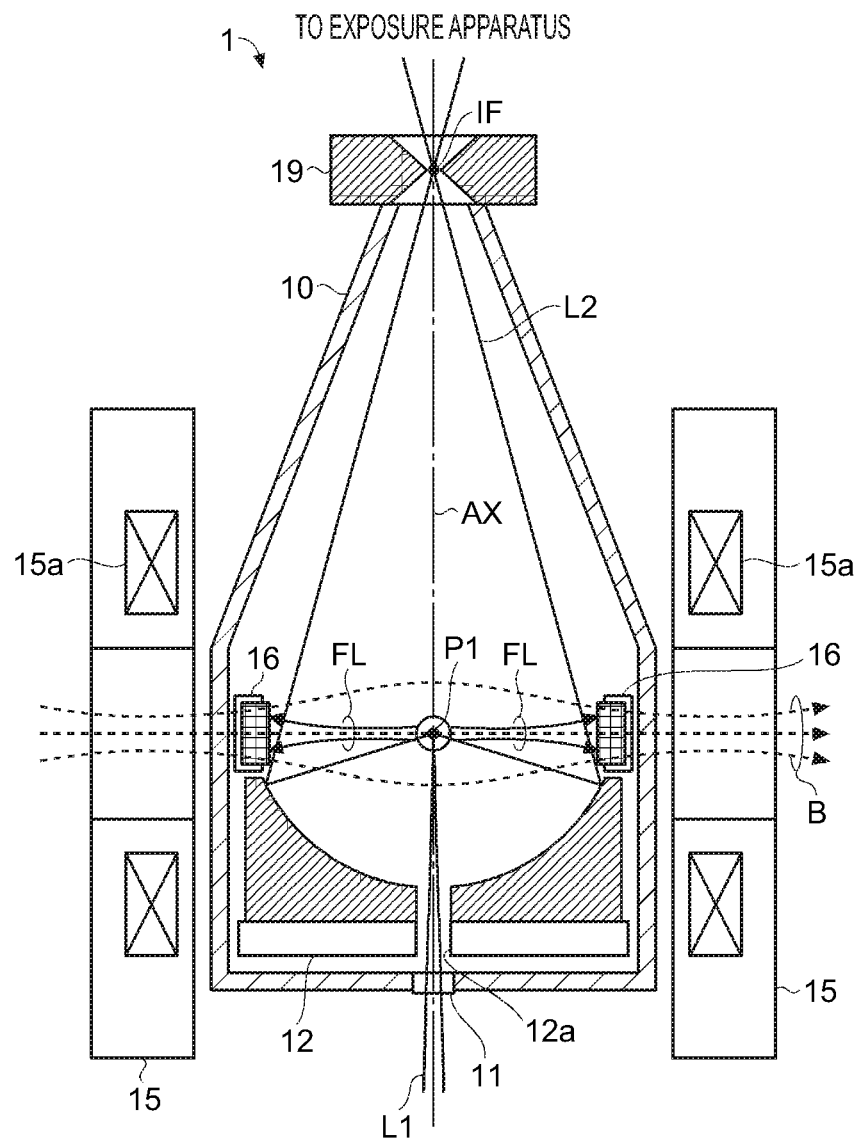
FIG. 2 is another sectional view schematically illustrating the example of the configuration of the EUV light generation apparatus shown in FIG. 1, taken along a different plane containing the axis of EUV light.

FIG. 2 is another sectional view schematically illustrating the example of the configuration of the EUV light generation apparatus shown in FIG. 1, taken along a different plane containing the axis (AX) of the EUV light.

As shown in FIG. 2, the EUV light generation apparatus 1 may further include magnetic field generation units 15 provided outside the chamber 10 and debris collection units 16 provided inside the chamber 10. The magnetic field generation units 15 may include a pair of electromagnetic coils 15a provided so as to face each other with the chamber 10 therebetween. The magnetic field generation units 15 may preferably be provided such that the line connecting the centers of the bores of the two electromagnetic coils 15a passes through the plasma generation region P1. With this arrangement, the magnetic field generation units 15 may generate a magnetic field B across the plasma generation region P1. Hereinafter, the line connecting the centers of the bores of the electromagnetic coils 15a may be referred to as the axis of the electromagnetic coils. The magnetic field B may trap charged debris among debris of the target material generated in the plasma generation region P1. The debris trapped in the magnetic field B may form an ion flow FL by the Lorentz force. The debris collection units 16 may be provided at positions toward which the ion flow FL travels. As the ion flow FL travels along the magnetic field B, the debris generated in the plasma generation region P1 may be collected into the debris collection units 16.

Figure 3A:
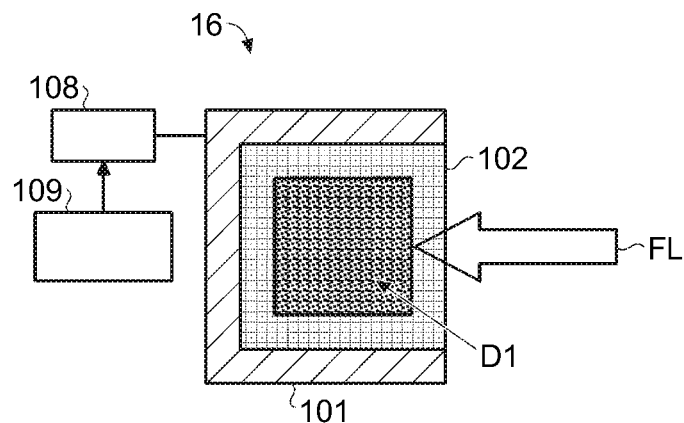
FIG. 3A is a sectional view schematically illustrating an example of the configuration of a debris collection unit according to the first embodiment.
Figure 3B:
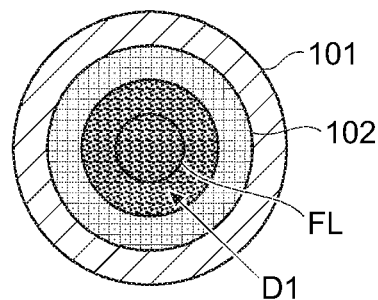
FIG. 3B schematically illustrates the example of the configuration of the debris collection unit shown in FIG. 3A, as viewed in a direction in which an ion flow enters the debris collection unit.

The debris collection unit 16 according to the first embodiment will now be described in detail with reference to the drawings. FIG. 3A is a sectional view schematically illustrating an example of the configuration of the debris collection unit according to the first embodiment. FIG. 3A is a section taken along a plane containing the axis of the electromagnetic coils. FIG. 3B schematically illustrates the example of the configuration of the debris collection unit shown in FIG. 3A, as viewed in the direction in which an ion flow enters the debris collection unit.

As shown in FIGS. 3A and 3B, the debris collection unit 16 may include a cylindrical porous member (porous material) 102 serving to trap Sn debris entering in the form of the ion flow FL. The porous member 102 may include, in a surface thereof, numerous openings communicating with air voids formed inside the porous member 102. Debris D1 entering the porous member 102 as the ion flow FL may be deactivated, cohered, and liquefied. The liquefied debris D1 may permeate through the openings in the surface of the porous member 102 into the air voids through the capillarity. In this way, the debris D1 may be trapped and stored inside the porous member 102.

The debris collection unit 16 may be provided with a heater 101 to heat the porous member 102. Electric current may be supplied to the heater 101 from a power supply 108 provided outside the chamber 10. The heater 101 may heat the porous member 102 to a temperature in a range within which the debris D1 is kept in a molten state. For example, when the target material is Sn, the porous member 102 may be heated to a temperature in a range equal to or higher than 232° C., which is the melting point of Sn. Being heated to a temperature in this range, the porous member 102 may be retained in a state in which the debris D1 can be trapped. Note that the porous member 102 may preferably be retained at a temperature lower than a temperature at which the material forming the porous member 102 reacts with the target material. For example, Sn reacts with Cu at or above 280° C. Thus, when the target material is Sn and the material forming the porous member 102 is Cu, the porous member 102 may preferably be retained at a temperature lower than 280° C. The temperature of the porous member 102 may be controlled through a temperature controller 109 connected to the power supply 108. The temperature controller 109 may be configured to control the electric current supplied to the heater 101 from the power supply 108.

The porous member 102 may preferably be formed of a material having high wettability with molten Sn. Wettability of various materials with molten Sn and sputtering rate against Sn ions are shown in Table 1 below. Generally, when the contact angle becomes small, the wettability is high. Examples of the material having high wettability with molten Sn may include aluminum (Al), copper (Cu), silicon (Si), nickel (Ni), and titanium (Ti), as shown in Table 1. By using a material having high wettability with the debris, the debris entering the porous member 102 may permeate into the porous member 102 efficiently. In turn, the amount of the debris that remains on the surface of the porous member 102 may be reduced. As a result, the debris trapped in the porous member 102 may be prevented from being sputtered by the ion flow FL.

TABLE 1

| | Wettability | | Sn Sputtering Properties Sputtering Rate | Porous Formation | |
| --- | --- | --- | --- | --- | --- |
| Material | Contact Angle | cosθ | 1 keV, AOI = 0° C. | Porosity | Pore Size |
| Al | 43 | 0.73 | 0.87 | 30-80% | 1-100 μm |
| Cu | 64 | 0.44 | 2.04 | 30-80% | 1-100 μm |
| Si | 79 | 0.19 | 0.44 | | |
| Ni | 80 | 0.17 | 1.49 | 30-80% | 1-100 μm |
| Ti | 89 | 0.02 | 0.41 | 30-80% | 25 μm |
| SiC | 138 | −0.74 | 0.60 | | |
| C | 180 | −1.0 | 0.16 | 12-17% | 2-3.5 μm |

With the above-described configuration, the debris generated when the EUV light L2 is generated may be collected in the debris collection unit 16. As a result, the deterioration in the performance of constituent elements provided in the chamber 10 caused by the debris depositing on the constituent elements may be suppressed.

While the debris collection unit 16 has been described above, it is possible to apply a similar configuration to the target collection unit 14, for example. In that case, the target material that has passed through the plasma generation region P1 may be collected into the target collection unit 14. Accordingly, the deterioration in the performance of the constituent elements provided in the chamber 10 caused by the target material depositing on the constituent elements may be suppressed.

Second Embodiment

An EUV light generation apparatus and a debris collection unit according to a second embodiment will now be described in detail with reference to the drawing. The EUV light generation apparatus according to the second embodiment may be similar in configuration to the EUV light generation apparatus 1 shown in FIGS. 1 and 2. In the EUV light generation apparatus of the second embodiment, however, the debris collection unit 16 may be replaced by a debris collection unit 216.

Figure 4:
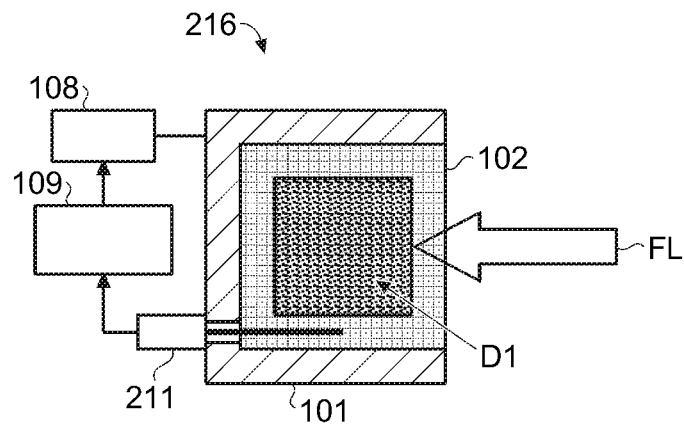
FIG. 4 is a sectional view schematically illustrating an example of the configuration of a debris collection unit according to a second embodiment.

FIG. 4 is a sectional view schematically illustrating an example of the configuration of the debris collection unit according to the second embodiment. FIG. 4 is a section along a plane containing the axis of the electromagnetic coils. As shown in FIG. 4, the debris collection unit 216 may include a temperature sensor 211 to detect the temperature of the porous member 102. Other configuration of the debris collection unit 216 may be similar to that of the debris collection unit 16 shown in FIGS. 3A and 3B. The temperature detected by the temperature sensor 211 may be inputted to the temperature controller 109. The temperature controller 109 may then carry out feedback control of the electric current supplied to the heater 101 from the power supply 108 based on the inputted temperature. Through this feedback control, the temperature of the porous member 102 may be controlled to fall within a predetermined temperature range (e.g., at or above 232° C. and below 280° C.) reliably.

Modification

Figure 5:
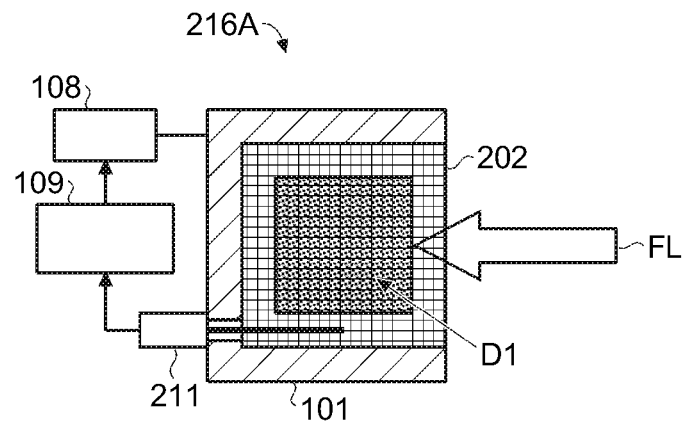
FIG. 5 is a sectional view schematically illustrating an example of the configuration of a debris collection unit according to a modification of the second embodiment.

FIG. 5 is a sectional view schematically illustrating an example of the configuration of a debris collection unit according to a modification of the second embodiment. In a debris collection unit 216A of the modification, the porous member 102 in the second embodiment above may be replaced by a mesh member (porous material) 202 as shown in FIG. 5. The mesh member 202 may have a three-dimensional mesh structure in which, for example, wires, ribbons, or the like intersect three-dimensionally. The mesh member 202 may include, in a surface thereof, numerous openings communicating with air voids formed inside the mesh member 202, as in the porous member 102. The debris D1 entering the mesh member 202 as the ion flow FL may permeate into the mesh member 202 through the openings in the surface into the air voids. Thus, the debris D1 may be trapped and stored in the mesh member 202.

The porous member 102 may be formed of any material having a structure which allows the liquid target material to permeate thereinto through the capillarity. Such a material may include, aside from the above-described porous members 102 and 202, a material obtained by sintering particles of several microns in size, a material obtained by solidifying fibrous members, and so forth. Moreover, replacing the porous member with the mesh member may also be applicable to other embodiments and any modifications thereof.

Third Embodiment

An EUV light generation apparatus and a debris collection unit according to a third embodiment will now be described in detail with reference to the drawing. The EUV light generation apparatus according to the third embodiment may be similar in configuration to the EUV light generation apparatus 1 shown in FIGS. 1 and 2. In the EUV light generation apparatus of the third embodiment, however, the debris collection unit 16 may be replaced by a debris collection unit 316.

Figure 6:
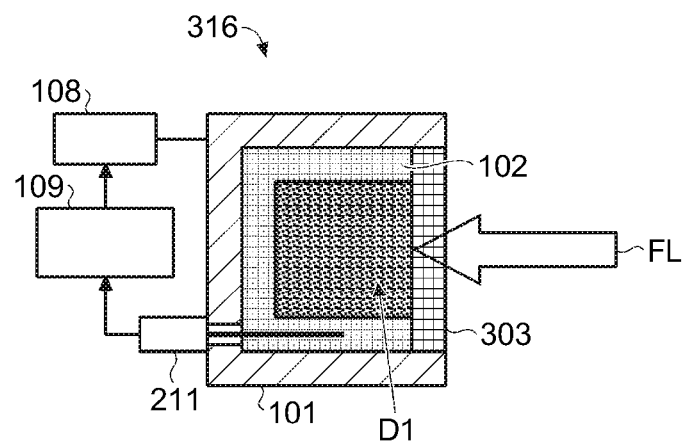
FIG. 6 is a sectional view schematically illustrating an example of the configuration of a debris collection unit according to a third embodiment.

FIG. 6 is a sectional view schematically illustrating an example of the configuration of the debris collection unit according to the third embodiment. FIG. 6 is a section along a plane containing the axis of the electromagnetic coils. As shown in FIG. 6, the debris collection unit 316 may include a mesh member 303 provided on a surface of the porous member 102. The mesh member 303 may, for example, be constituted by a member having a similar configuration to the mesh member 202 shown in FIG. 5. For example, the mesh member 303 may include, in a surface thereof, numerous openings communicating with air voids formed inside the mesh member 303. Other configuration of the debris collection unit 316 may be similar to that of the debris collection unit 216 shown in FIG. 4. The debris D1 may first enter the mesh member 303 as the ion flow FL, and permeate into the mesh member 303 through the openings formed in the surface thereof. Then, the debris D1 may permeate into the porous member 102 that is in contact with the mesh member 303. With this arrangement, the debris D1 may be trapped and stored inside the porous member 102. Here, the mesh member 303 may preferably have lower wettability with the debris D1 than the porous member 102.

The mesh member 303 may preferably be formed of a material that is less likely to be sputtered when the ion flow FL enters the mesh member 303, and such materials are listed partially in Table 1 above. Examples of such materials may include carbon (C), tungsten (W), silicon (Si), tungsten carbide (WC), titanium (Ti), silicon carbide (SiC), and aluminum (Al).

Modification

Figure 7:
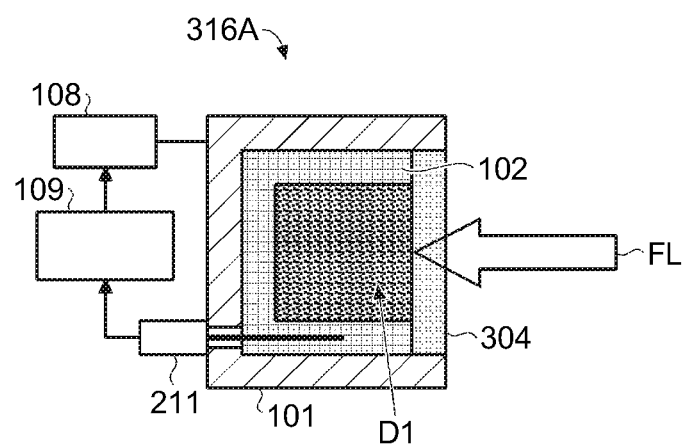
FIG. 7 is a sectional view schematically illustrating an example of the configuration of a debris collection unit according to a modification of the third embodiment.

FIG. 7 is a sectional view schematically illustrating an example of the configuration of a debris collection unit according to a modification of the third embodiment. In a debris collection unit 316A of the modification, the mesh member 303 in the third embodiment above may be replaced by a porous member 304 as shown in FIG. 7. The porous member 304 may include, in a surface thereof, numerous openings communicating with air voids formed thereinside, as in the porous member 102. The debris D1 may first enter the porous member 304 as the ion flow FL, and may permeate into the porous member 304 through the openings in the surface thereof. Then, the debris D1 may permeate into the porous member 102 that is in contact with the porous member 304. With this arrangement, the debris D1 may be trapped and stored inside the porous member 102. The porous member 304 may preferably be formed of a material that is less likely to be sputtered when the ion flow FL enters the porous member 304. Further, the porous member 304 may preferably have lower wettability with the debris D1 than the porous member 102.

The mesh member 303 and the porous member 304 may be formed of any material having a structure which allows the liquid target material to permeate thereinto through the capillarity. Such materials may include a material obtained by sintering particles of several microns in size, a material obtained by solidifying fibrous members, and so forth. The mesh member 303 and the porous member 304 may be several tens of microns in thickness in the direction in which the ion flow FL enters. The configuration in which the mesh member 303 or the porous member 304 is provided on the surface of the debris collection unit which the ion flow FL enters may also be applicable to other embodiments and modifications thereof.

Fourth Embodiment

An EUV light generation apparatus and a debris collection unit according to a fourth embodiment will now be described in detail with reference to the drawing. The EUV light generation apparatus according to the fourth embodiment may be similar in configuration to the EUV light generation apparatus 1 shown in FIGS. 1 and 2. In the EUV light generation apparatus of the fourth embodiment, however, the debris collection unit 16 may be replaced by a debris collection unit 416.

Figure 8:
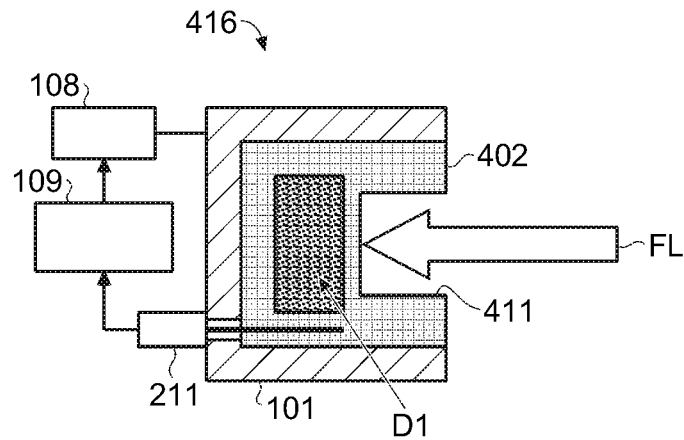
FIG. 8 is a sectional view schematically illustrating an example of the configuration of a debris collection unit according to a fourth embodiment.

FIG. 8 is a sectional view schematically illustrating an example of the configuration of the debris collection unit according to the fourth embodiment. FIG. 8 is a section along a plane containing the axis of the electromagnetic coils. As shown in FIG. 8, the debris collection unit 416 may be similar in configuration to the debris collection unit 216 shown in FIG. 4. However, in the debris collection unit 416, the porous member 102 may be replaced by a porous member 402. The porous member 402 may, for example, be constituted by a similar member to the porous member 102 shown in FIG. 4. The porous member 402 may include a cup-shaped pocket 411 formed in a surface thereof. The pocket 411 may preferably be wider in diameter than the cross-section of the ion flow FL. Providing the pocket 411 in the surface which the ion flow FL enters to receive the ion flow FL may allow sputtered materials generated as the ion flow FL enters the porous member 402 to be trapped on the side surface in the pocket 411. With this configuration, the sputtered materials may be prevented from being scattered inside the chamber 10.

First Modification

Figure 9:
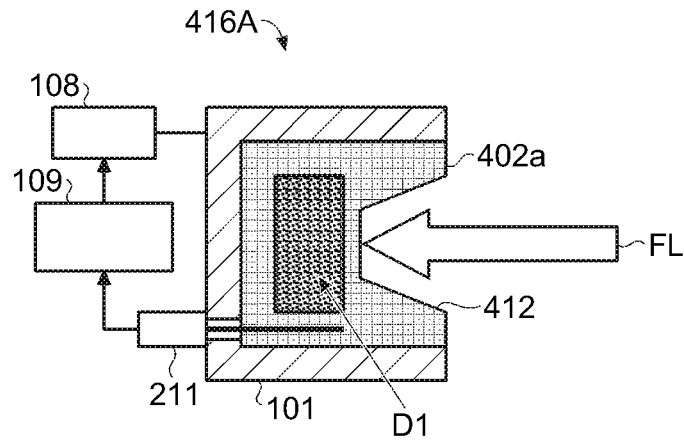
FIG. 9 is a sectional view schematically illustrating an example of the configuration of a debris collection unit according to a first modification of the fourth embodiment.

FIG. 9 is a sectional view schematically illustrating an example of the configuration of a debris collection unit according to a first modification of the fourth embodiment. In a debris collection unit 416A of the first modification, the porous member 402 of the fourth embodiment above may be replaced by a porous member 402a as shown in FIG. 9. In the porous member 402a, the pocket 411 in the porous member 402 may be replaced by a frustoconical pocket 412. Since the side surface of the pocket 412 is inclined with respect to the direction in which the ion flow FL enters, the collision density of the debris per unit area, which the side surface receives from each individual particle in the debris, may be reduced. As a result, the occurrence of sputtering caused as the ion flow FL enters the porous member 402a may be suppressed.

Second Modification

Figure 10:
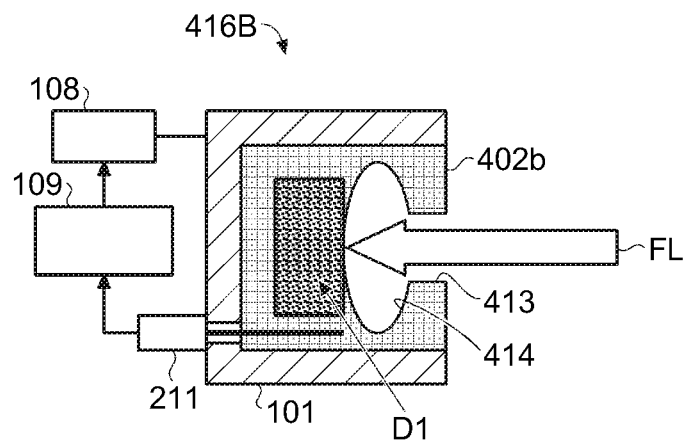
FIG. 10 is a sectional view schematically illustrating an example of the configuration of a debris collection unit according to a second modification of the fourth embodiment.

FIG. 10 is a sectional view schematically illustrating an example of the configuration of a debris collection unit according to a second modification of the fourth embodiment. In a debris collection unit 416B of the second modification, the porous member 402 of the fourth embodiment above may be replaced by a porous member 402b as shown in FIG. 10. In the porous member 402b, the pocket 411 in the porous member 402 may be replaced by a combination of an opening 413 and a space 414. The opening 413 may be formed in the surface of the porous member 402b. The opening 413 may preferably be wider in diameter than the cross-section of the ion flow FL. The space 414 may be formed inside the porous member 402b, and in communication with the opening 413. The maximum inner diameter of the space 414 may preferably be wider than the diameter of the opening 413. Since a space (the space 414) wider than the diameter of the opening 413 is provided inside the porous member 402b, sputtered materials generated as the ion flow FL enters the porous member 402b may be more reliably prevented from being scattered inside the chamber 10.

Fifth Embodiment

An EUV light generation apparatus and a debris collection unit according to a fifth embodiment will now be described in detail with reference to the drawing. The EUV light generation apparatus according to the fifth embodiment may be similar in configuration to the EUV light generation apparatus 1 shown in FIGS. 1 and 2. In the EUV light generation apparatus of the fifth embodiment, however, the debris collection unit 16 may be replaced by a debris collection unit 516.

Figure 11:
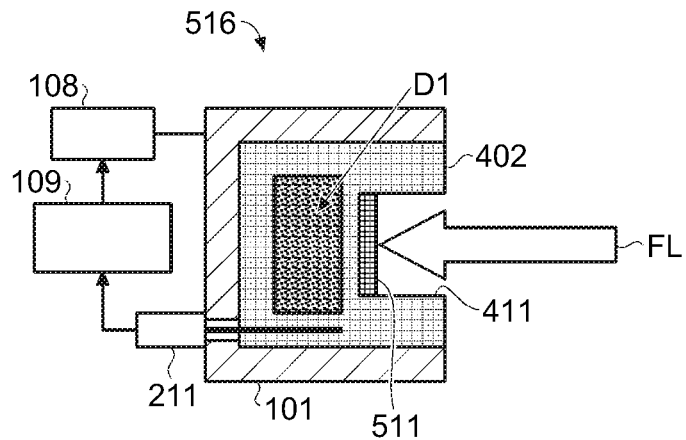
FIG. 11 is a sectional view schematically illustrating an example of the configuration of a debris collection unit according to a fifth embodiment.

FIG. 11 is a sectional view schematically illustrating an example of the configuration of the debris collection unit according to the fifth embodiment. FIG. 11 is a section along a plane containing the axis of the electromagnetic coils. As shown in FIG. 11, the debris collection unit 516 may include a mesh member 511 serving as a sputtering prevention part on the bottom of the pocket 411, i.e., on the surface which the ion flow FL enters. The mesh member 511 may, for example, be formed of a material having a similar structure to the mesh member 303 shown in FIG. 6. For example, the mesh member 511 may include, in the surface which the ion flow FL enters, numerous openings communicating with air voids formed inside the mesh member 511. Other configuration of the debris collection unit 516 may be similar to that of the debris collection unit 416 shown in FIG. 8. The debris D1 may first enter the mesh member 511 as the ion flow FL, and permeate into the mesh member 511 through the openings formed in the surface thereof. Then, the debris D1 may permeate into the porous member 402 that is in contact with the mesh member 511. With this arrangement, the debris D1 may be trapped and stored inside the porous member 402. Here, the mesh member 511 may preferably have lower wettability with the debris D1 than the porous member 402.

First Modification

Figure 12:
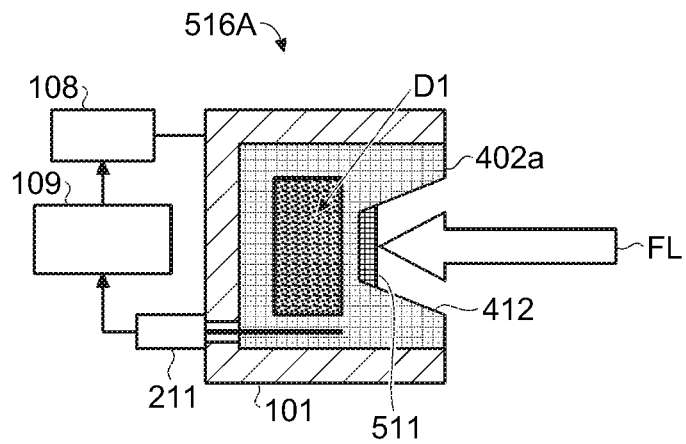
FIG. 12 is a sectional view schematically illustrating an example of the configuration of a debris collection unit according to a first modification of the fifth embodiment.

FIG. 12 is a sectional view schematically illustrating an example of the configuration of a debris collection unit according to a first modification of the fifth embodiment. A debris collection unit 516A of the first modification may be similar in configuration to the debris collection unit 516 shown in FIG. 11. The debris collection unit 516A may also include the mesh member 511 serving as the sputtering prevention part provided on the bottom of the frustoconical pocket 412, i.e., on the surface which the ion flow FL enters. Other configuration of the debris collection unit 516A may be similar to that of the debris collection unit 416A shown in FIG. 9. The debris D1 may first enter the mesh member 511 as the ion flow FL, and permeate into the mesh member 511 through the openings formed in the surface thereof. Then, the debris D1 may permeate into the porous member 402a that is in contact with the mesh member 511. With this arrangement, the debris D1 may be trapped and stored in the porous member 402a. Here, the mesh member 511 may preferably have lower wettability with the debris D1 than the porous member 402a.

Second Modification

Figure 13:
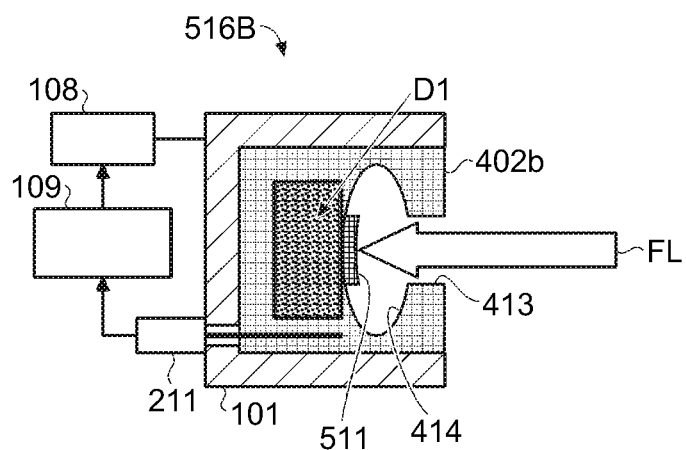
FIG. 13 is a sectional view schematically illustrating an example of the configuration of a debris collection unit according to a second modification of the fifth embodiment.

FIG. 13 is a sectional view schematically illustrating an example of the configuration of a debris collection unit according to a second modification of the fifth embodiment. A debris collection unit 516B of the second modification may also include the mesh member 511 serving as the sputtering prevention part, as in the debris collection unit 516 shown in FIG. 11 and the debris collection unit 516A shown in FIG. 12. The mesh member 511 may be provided on the surface in the space 414 of the porous member 402b which the ion flow FL enters. Other configuration of the debris collection unit 516B may be similar to that of the debris collection unit 416B shown in FIG. 10. The debris D1 may first enter the mesh member 511 as the ion flow FL, and permeate into the mesh member 511 through the openings formed in the surface thereof. Then, the debris D1 may permeate into the porous member 402b that is in contact with the mesh member 511. With this arrangement, the debris D1 may be trapped and stored in the porous member 402b. Here, the mesh member 511 may preferably have lower wettability with the debris D1 than the porous member 402b.

Sixth Embodiment

An EUV light generation apparatus and a debris collection unit according to a sixth embodiment will now be described in detail with reference to the drawings. The EUV light generation apparatus according to the sixth embodiment may be similar in configuration to the EUV light generation apparatus 1 shown in FIGS. 1 and 2. In the EUV light generation apparatus of the sixth embodiment, however, the debris collection unit 16 may be replaced by a debris collection unit 616.

Figure 14A:
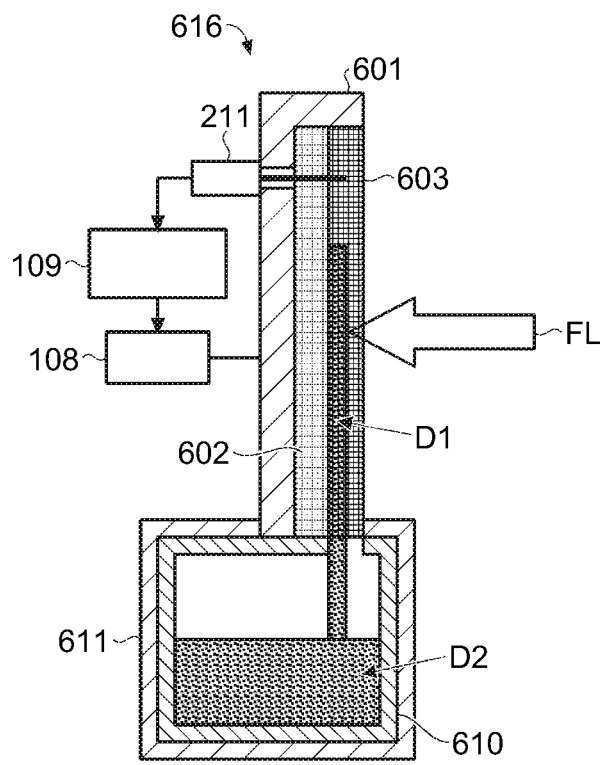
FIG. 14A is a sectional view schematically illustrating an example of the configuration of a debris collection unit according to a sixth embodiment.
Figure 14B:
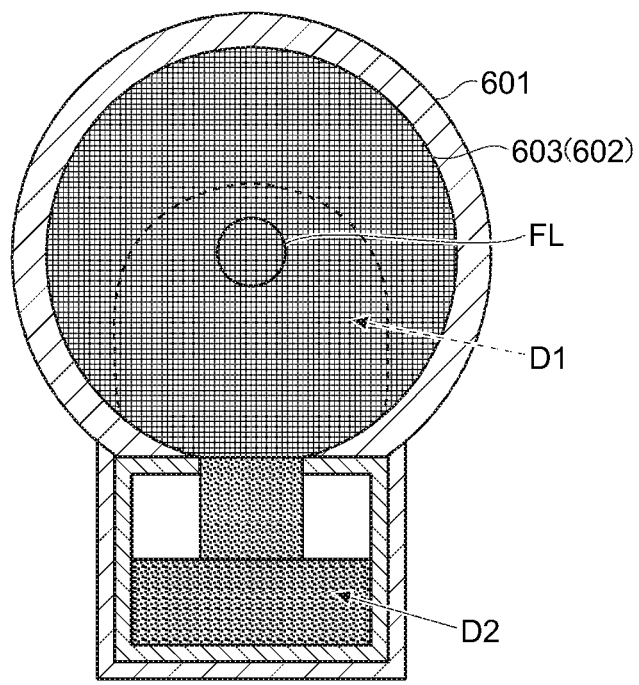
FIG. 14B schematically illustrates the example of the configuration of the debris collection unit shown in FIG. 14A, as viewed in the direction in which an ion flow enters the debris collection unit.

FIG. 14A is a sectional view schematically illustrating an example of the configuration of the debris collection unit according to the sixth embodiment. FIG. 14A is a section along a plane containing the axis of the electromagnetic coils. FIG. 14B schematically illustrates the example of the configuration of the debris collection unit shown in FIG. 14A, as viewed in the direction in which an ion flow enters the debris collection unit. As shown in FIGS. 14A and 14B, the debris collection unit 616 may include a disc-shaped porous member 602 and a disc-shaped mesh member 603 provided on a surface of the porous member 602. The porous member 602 may, for example, be formed of a similar material to the porous member 102 shown in FIG. 4. The mesh member 603 may, for example, be formed of a material having a similar structure to the mesh member 303 shown in FIG. 6. For example, the mesh member 603 may include, in a surface thereof, numerous openings communicating with air voids formed inside the mesh member 603. The debris D1 may first enter the mesh member 603 as the ion flow FL, and permeate into the mesh member 603 through the openings formed in the surface thereof. Then, the debris D1 may permeate into the porous member 602 that is in contact with the mesh member 603. With this arrangement, the debris D1 may be trapped inside the porous member 602. Here, the mesh member 603 may preferably have lower wettability with the debris D1 than the porous member 602. In place of the porous member 602, a plate member may be used. The plate member may preferably have low wettability with molten debris.

The debris collection unit 616 may further be provided with a heater 601 to heat the porous member 602 and the mesh member 603 to a temperature equal to or higher than the melting point of the debris D1. The temperature controller 109 may be configured to control the electric current supplied from the power supply 108 to the heater 601 based on the temperature detected by the temperature sensor 211. With this configuration, the temperature of the porous member 602 and the mesh member 603 may be controlled reliably to fall within a predetermined temperature range (e.g., at or above the melting point of Sn).

When the temperature of the porous member 602 and the mesh member 603 are controlled to a temperature equal to or higher than the melting point of the debris D1, the debris D1 trapped in the porous member 602 may be retained in a molten state. Accordingly, the molten debris D1 may flow downwardly in the vertical direction (downward direction in the drawing sheet). A collection container 610 may be provided below the porous member 602 and the mesh member 603 in the vertical direction. The collection container 610 may have an opening at a connection part where the collection container 610 is connected to at least either of the porous member 602 and the mesh member 603. Thus, the molten debris D1 flowing downward from the porous member 602 and/or the mesh member 603 may flow into the collection container 610. With this arrangement, the debris D1 trapped in the porous member 602 and/or the mesh member 603 may be stored in the collection container 610 as debris D2.

As described above, a container for storing the debris D2 being provided aside from a unit for trapping the debris D1, a larger amount of Sn may be stored, compared, for example, with a case where the debris D1 is stored in the porous member and/or in the mesh member. As a result, the frequency of performing maintenance work may be reduced. Further, forming the mesh member 603 of a material having lower wettability with the debris D1 than the porous member 602 may allow the molten debris D1 to flow smoothly into the collection container 610. The collection container 610 may be provided with a heater 611 to retain the temperature of the collection container 610 at a temperature at which the debris D2 stored therein remains in a liquid state. Retaining the temperature of the collection container 610 at a temperature at which the debris D2 remains in a liquid state may allow the debris D2 to be stored in the collection container 610 in a liquid state. Accordingly, the volumetric efficiency for storing the debris D2 may be increased.

First Modification

Figure 15:
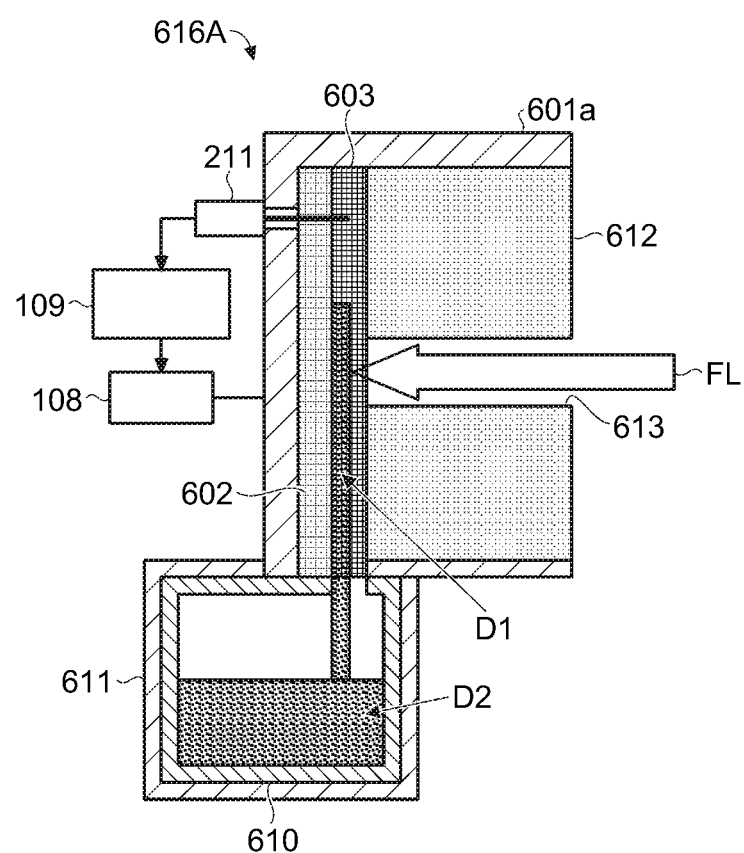
FIG. 15 is a sectional view schematically illustrating an example of the configuration of a debris collection unit according to a first modification of the sixth embodiment.

FIG. 15 is a sectional view schematically illustrating an example of the configuration of a debris collection unit according to a first modification of the sixth embodiment. A debris collection unit 616A of the first modification may include a cylindrical porous member 612 provided on a surface of the mesh member 603. The porous member 612 may include an opening 613 preferably wider than the cross-section of the ion flow FL. Other configuration of the debris collection unit 616A may be similar to that of the debris collection unit 616 shown in FIGS. 14A and 14B. Providing the cylindrical porous member 612 on the surface of the mesh member 603 to receive the ion flow FL may allow sputtered materials, generated as the ion flow FL enters the mesh member 603 and/or the porous member 612, to be trapped on the side surface of the opening in the porous member 612. With this configuration, the sputtered materials may be prevented from being scattered inside the chamber 10. The heater 601 in the debris collection unit 616 shown in FIGS. 14A and 14B may be replaced by a heater 601a configured to heat the porous member 602, the mesh member 603, and the porous member 612.

Second Modification

Figure 16:
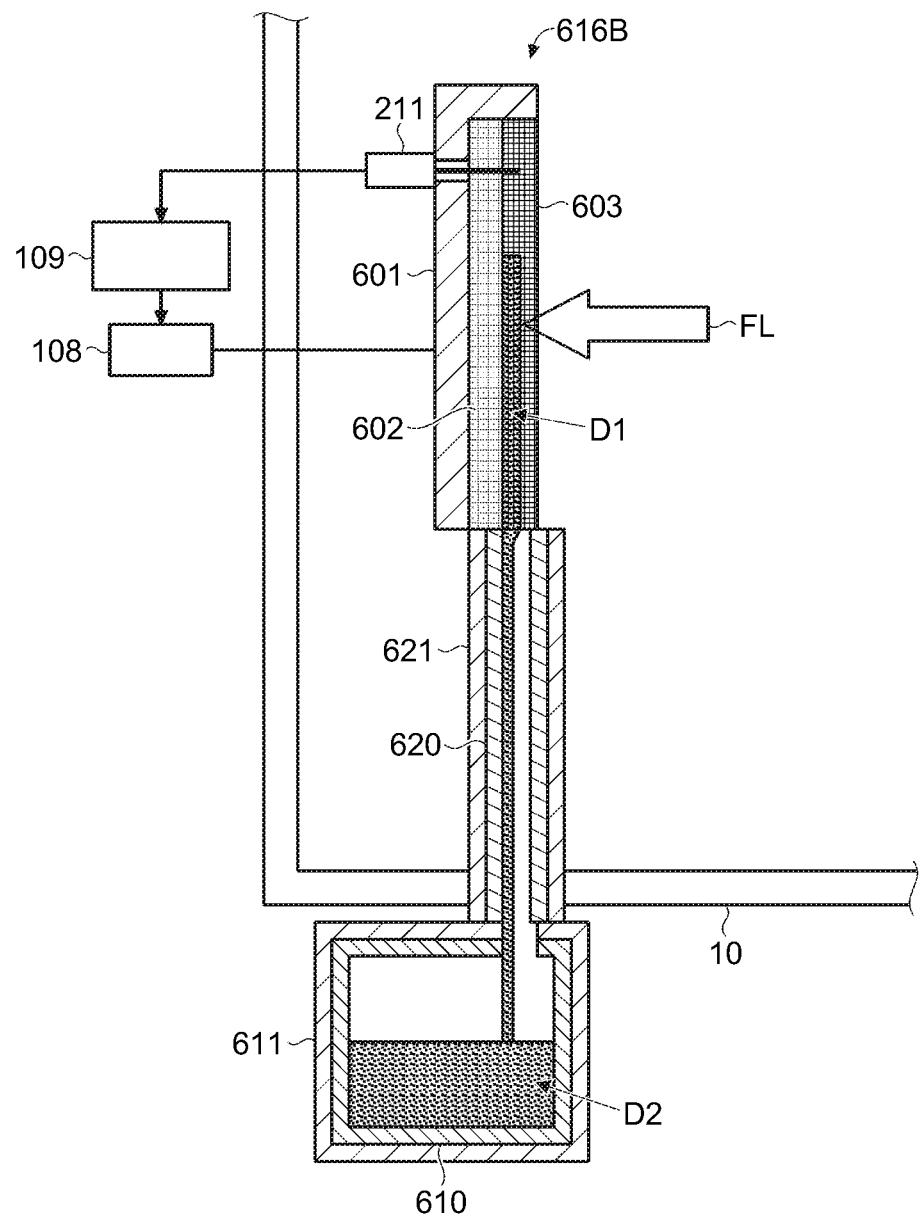
FIG. 16 is a sectional view schematically illustrating an example of the configuration of a debris collection unit according to a second modification of the sixth embodiment.

FIG. 16 is a sectional view schematically illustrating an example of the configuration of a debris collection unit according to a second modification of the sixth embodiment. A debris collection unit 616B of the second modification may be similar in configuration to the debris collection unit 616 shown in FIGS. 14A and 14B. However, the collection container 610 of the debris collection unit 616B may be provided outside the chamber 10. A drain pipe 620 may be provided between the collection container 610 and the porous member 602 and/or the mesh member 603 to guide the molten debris D1 flowing out of the porous member 602 and/or the mesh member 603 to the collection container 610. The drain pipe 620 may be heated to a temperature equal to or higher than the melting point of the debris D1, for example, by a heater 621. With such a configuration, the collection container 610 need not be provided inside the chamber 10, which has limited capacity. Hence, the collection container 610 of relatively large capacity may be provided outside the chamber 10, and as a result, the frequency of performing maintenance work may be reduced.

Third Modification

Figure 17:
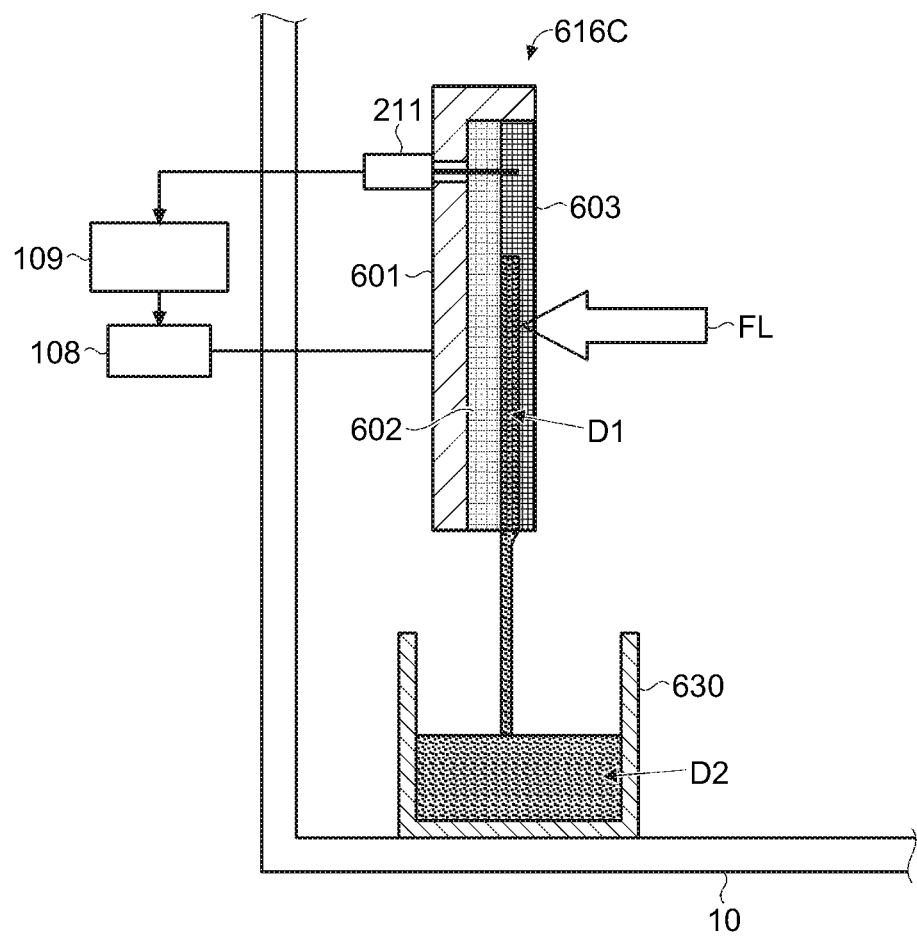
FIG. 17 is a sectional view schematically illustrating an example of the configuration of a debris collection unit according to a third modification of the sixth embodiment.

FIG. 17 is a sectional view schematically illustrating an example of the configuration of a debris collection unit according to a third modification of the sixth embodiment. A debris collection unit 616C of the third modification may be similar in configuration to the debris collection unit 616 shown in FIGS. 14A and 14B. However, in the debris collection unit 616C, the collection container 610 may be replaced by a collection container 630 separated from the porous member 602 and the mesh member 603. The collection container 630 may be provided on an inner wall of the chamber 10 and below the porous member 602 and the mesh member 603 in the vertical direction. The collection container 630 may be removably attached to the chamber 10 through an attachment (not separately shown). The debris D1 (molten Sn) trapped in the porous member 602 and/or the mesh member 603 may mainly flow out of the mesh member 603, and be collected into the collection container 630 as the debris D2. With such a configuration, since only the collection container 630 can be removed from the chamber 10, the maintenance work can be facilitated.

Seventh Embodiment

An EUV light generation apparatus and a debris collection unit according to a seventh embodiment will now be described in detail with reference to the drawings. The EUV light generation apparatus according to the seventh embodiment may be similar in configuration to the EUV light generation apparatus 1 shown in FIGS. 1 and 2. In the EUV light generation apparatus of the seventh embodiment, however, the debris collection unit 16 may be replaced by a debris collection unit 716.

Figure 18A:
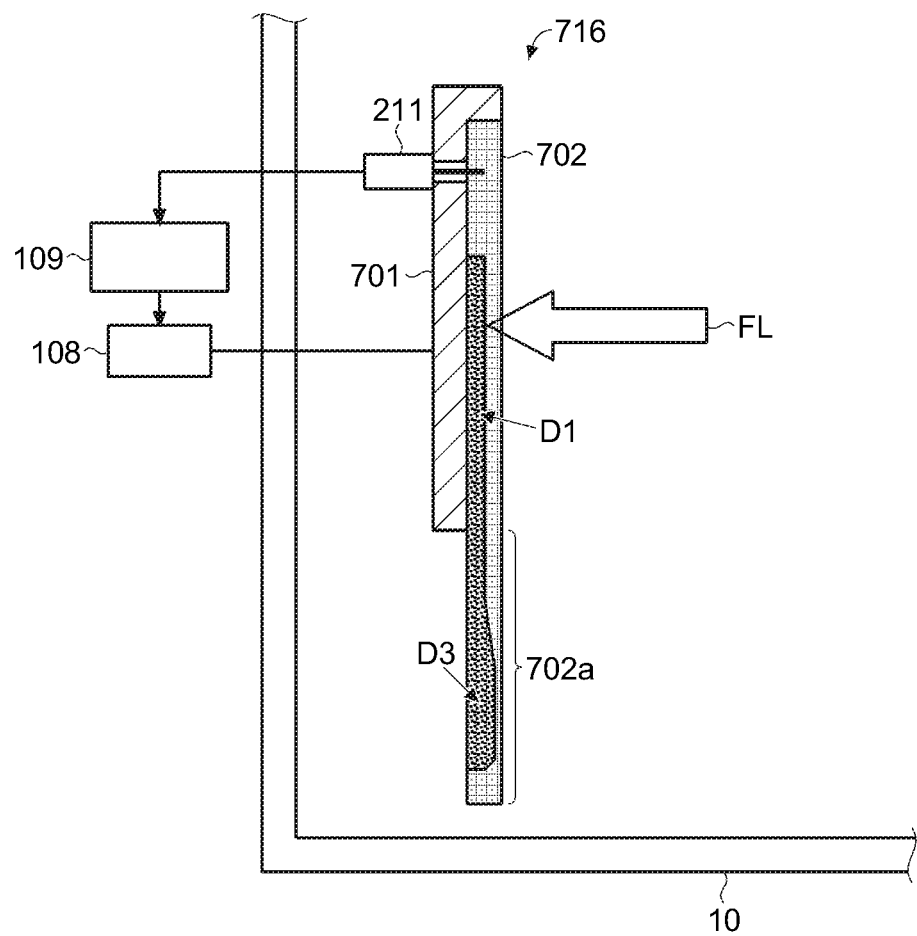
FIG. 18A is a sectional view schematically illustrating an example of the configuration of a debris collection unit according to a seventh embodiment.
Figure 18B:
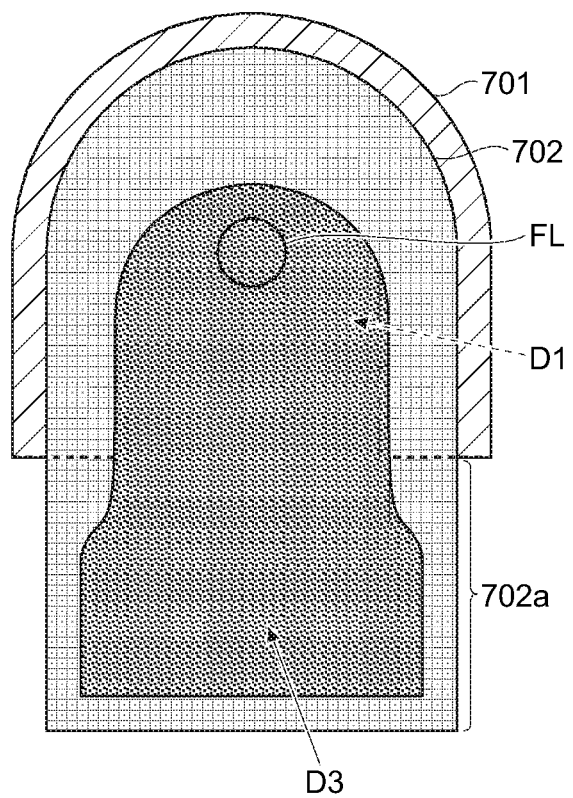
FIG. 18B schematically illustrates the example of the configuration of the debris collection unit shown in FIG. 18A, as viewed in the direction in which an ion flow enters the debris collection unit.

FIG. 18A is a sectional view schematically illustrating an example of the configuration of the debris collection unit according to the seventh embodiment. FIG. 18A is a section along a plane containing the axis of the electromagnetic coils. FIG. 18B schematically illustrates the example of the configuration of the debris collection unit shown in FIG. 18A, as viewed in the direction in which an ion flow enters the debris collection unit. As shown in FIGS. 18A and 18B, the debris collection unit 716 may include an oblong plate-shaped porous member 702. The porous member 702 may, for example, be formed of a similar material to the porous member 102 shown in FIG. 4.

One end of the porous member 702 in the lengthwise direction may be semicircular in shape. The porous member 702 may be positioned such that the semicircular portion is located upward in the vertical direction (see FIG. 18B). The temperature sensor 211 connected to the temperature controller 109 and a heater 701 connected to the power supply 108 may be provided on a part of the porous member 702. For example, the temperature sensor 211 and the heater 701 may be provided on the semicircular portion of the porous member 702. The temperature controller 109 may carry out feedback-control of the heater 701 and the power supply 108 such that the temperature of the porous member 702 falls within a predetermined temperature range (e.g., at or above 232° C. and below 280° C.) based on the temperature detected by the temperature sensor 211. Hence, the debris D1 trapped in the porous member 702 may flow downwardly in the vertical direction while being retained in a molten state.

The other end of the porous member 702 in the lengthwise direction may project downwardly from the heater 701. This projecting portion may function as a storage portion 702a to store the debris D1 trapped in the upper part of the porous member 702. The storage portion 702a may not be directly heated by the heater 701; thus, the temperature of the storage portion 702a may be lower than the melting point of the debris D1. Hence, the molten debris D1 flowing down from the upper part of the porous member 702 may flow into the storage portion 702a, and be cooled to be solidified. With this configuration, the debris D1 may be stored in the storage portion 702a as debris D3.

Eighth Embodiment

In the above-described embodiments and the modifications thereof, part of the debris collection unit which the ion flow enters has been formed of a material that allows the molten debris to permeate thereinto (e.g., the porous member or the mesh member). However, this disclosure is not limited thereto. For example, a member that does not allow the molten debris to permeate thereinto may be provided on the part which the ion flow enters. Such a member may preferably be formed of a material having low wettability with the molten debris. Hereinafter, an embodiment with such a member will be described in detail as an eighth embodiment with reference to the drawings.

Figure 19A:
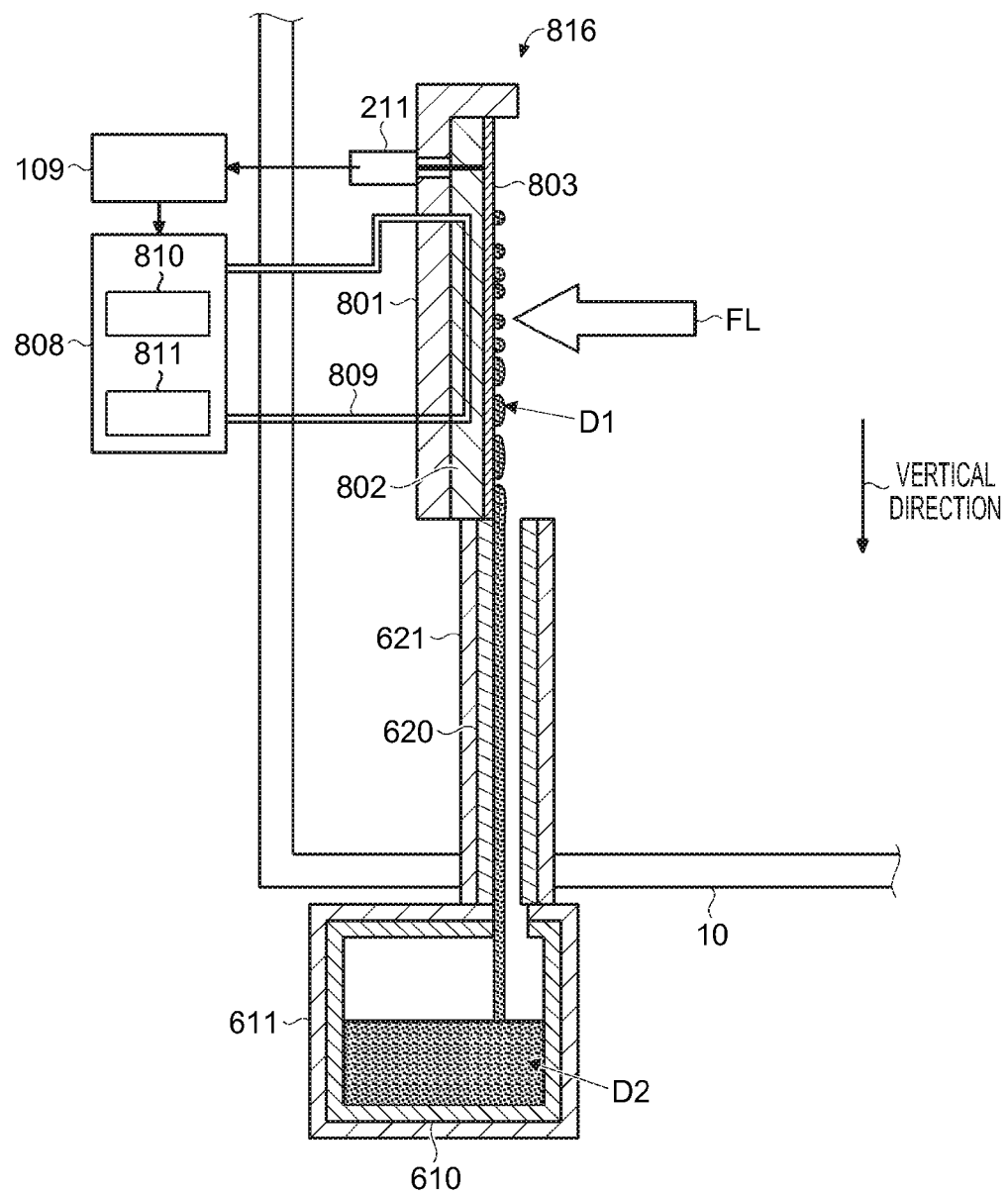
FIG. 19A is a sectional view schematically illustrating an example of the configuration of a debris collection unit according to an eighth embodiment.
Figure 19B:
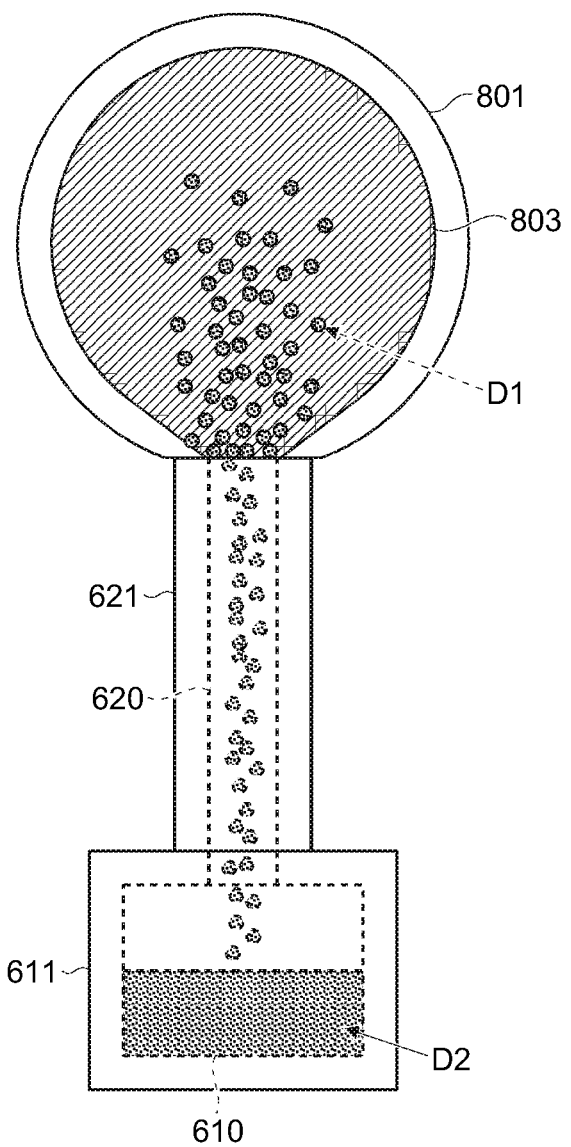
FIG. 19B schematically illustrates the example of the configuration of the debris collection unit shown in FIG. 19A, as viewed in the direction in which an ion flow enters the debris collection unit.

FIG. 19A is a sectional view schematically illustrating an example of the configuration of a debris collection unit according to the eighth embodiment, taken along a plane containing the axis of the electromagnetic coils. FIG. 19B schematically illustrates the example of the configuration of the debris collection unit shown in FIG. 19A, as viewed in the direction in which an ion flow enters the debris collection unit.

As shown in FIGS. 19A and 19B, a debris collection unit 816 of the eighth embodiment may be similar in configuration to the debris collection unit 616B shown in FIG. 16. However, in the debris collection unit 816, the porous member 602 and the mesh member 603 (see FIG. 16) may be replaced by a plate member 802. The plate member 802 may be held, for example, by a holder 801. The plate member 802 may be coated with a coating 803 on a surface thereof.

The plate member 802 may preferably be formed, for example, of a material having high thermal conductivity. Such a material may include a metal material, such as copper, or a ceramic material, such as SiC. The coating 803 may preferably be formed, for example, of a material that has low wettability with the molten debris and excels in anti-sputtering properties. Further, the coating 803 may preferably be formed of a material that is weakly reactive with the debris (the debris formed of Sn in the eighth embodiment). Furthermore, in the case where a reactive gas, such as hydrogen, is introduced into the chamber 10 to mitigate the debris, the coating 803 may preferably be formed of a material which is weakly reactive with the reactive gas. Examples of such a material may include SiC and carbon (C). When SiC is used as the material of the coating 803, the coating 803 may be formed through chemical vapor deposition (CVD). The surface of the coating 803 may preferably be rough to some extent. Accordingly, the surface of the coating 803 may be roughly polished or left unpolished.

The temperature of the debris collection unit 816 may rise as the ion flow FL collides with the debris collection unit 816. The temperature of the surface of the coating 803 may preferably be equal to or higher than the melting point of the debris. However, when the temperature of the surface of the coating 803 is excessively high, the debris deposited on the surface of the coating 803 may become susceptible to sputtering. Therefore, the temperature of the surface of the coating 803 may preferably be controlled to fall within a predetermined range. Hence, in the eighth embodiment, the debris collection unit 816 may be provided with a cooler 808, as shown in FIGS. 19A and 19B. A pipe 809 serving as a cooling member of the cooler may be connected to the cooler 808, through which a cooling medium such as cooled silicon oil, organic compound liquid, or the like flows. A part of the pipe 809 may run inside or along the rear surface of the plate member 802. The cooling medium cooled in the cooler 808 may flow through the pipe 809, whereby the plate member 802 may be cooled so that the temperature of the surface of the coating 803 does not become excessively high. The cooler 808 and the pipe 809 may be applied to any of the above-described embodiments and the modifications thereof. The cooler 808 may include a supply unit 810 and a control valve 811. The supply unit 810 may be configured to supply the cooling medium to the pipe 809. The control valve 811 may be configured to control a flow rate of the cooling medium flowing in the pipe 809.

When the temperature detected by the temperature sensor 211 exceeds, for example, a first predetermined threshold temperature, the temperature controller 109 may actuate the cooler 808. As the cooler 808 is actuated, the cooled cooling medium may be fed into the pipe 809, and the surface of the coating 803 may be cooled through the plate member 802. For example, the first threshold temperature may be higher than a second threshold temperature which will be discussed later. Further, the first threshold temperature may be set below a temperature at which the coating 803 and the plate member 802 thermally deform. The cooling medium may be fed continuously into the pipe 809 until, for example, the temperature detected by the temperature sensor 211 falls below the second predetermined threshold temperature. The second threshold temperature may, for example, be set above the melting point of the target material (e.g., Sn).

With such configuration and operation, the temperature of the surface of the coating 803 with which the ion flow FL collides may be retained to fall within a predetermined temperature range. The surface of the coating 803 may have low wettability with the molten debris. Thus, the debris adhered to the surface of the coating 803 may flow downwardly in the vertical direction with its own weight in a molten state. The drain pipe 620 may be provided at a position toward which the debris flows, as in the configuration shown in FIG. 16. The collection container 610 may be provided at the downstream end of the drain pipe 620. Hence, the debris flowing downwardly in the vertical direction may be collected into the collection container 610 through the drain pipe 620.

In the eighth embodiment, the cooler 808 may be replaced by a constant-temperature circulator or the like capable of both heating and cooling.

Ninth Embodiment

A Material for forming the plate member 802 described in the eighth embodiment will now be discussed in more detail. The plate member 802 may be formed of a material having low wettability with molten Sn. In such a case, the coating 803 need not be provided on the surface of the plate member 802. That is, in the ninth embodiment, a material having low wettability with molten Sn may be provided on the surface which the debris enters.

As described above regarding the eighth embodiment, the coating 803 may preferably be formed of a material that has low wettability with the molten debris and excels in anti-sputtering properties. Generally, a material having a contact angle $\theta$ of $0°<\theta\leq90°$ has immersional wetting properties. Thus, when the coating 803 is formed of a material having such a contact angle $\theta$ with the molten debris, the debris adhered to the surface of the coating 803 may be immersed into the coating 803. On the other hand, a material having the contact angle $\theta$ greater than 90° has adhesive wetting properties. Thus, when the coating 803 is formed of a material having such a contact angle $\theta$ with the molten debris, the debris adhered to the surface of the coating 803 may be less likely to further wet the surface and may remain on the surface of the coating 803 for some time. Then, the debris adhered to the surface of the coating 803 may flow downwardly in the vertical direction with its own weight.

The contact angles of various materials with molten Sn are shown in Table 2 below.

Table 2

| Material | Contact Angle (°) |
| --- | --- |
| Mo | 30-70 |
| SiC | 123-150 |
| SiN | 140-168 |
| $Al_2O_3$ | 163 |
| $ZrO_2$ | 140-153 |
| Graphite | 149 |
| Diamond | 125-135 |
| $SiO_x$ | 120-150 |
| $MoO_x$ (Without Preheating in Vacuum) | 120-130 |

As is clear from the Table 2, silicon carbide (SiC), silicon nitride (SiN), aluminum oxide ($Al_2O_3$), zirconium oxide ($ZrO_2$), graphite, diamond, silicon oxide ($SiO_x$), and molybdenum oxide ($MoO_x$) have their contact angle $\theta$ greater than 90° with molten Sn and thus have low wettability with molten Sn. Accordingly, these materials may be suitable as the material of the coating 803 and the plate member 802.

Aside from the materials listed in Table 2, tungsten (W), and tantalum (Ta), when being oxidatively treated, may have low wettability with molten Sn. Thus, these materials may also be suitable as the material of the coating 803 and the plate member 802.

Now, reactivity of various materials with molten Sn will be discussed. Generally, tungsten (W), tantalum (Ta), and molybdenum (Mo), which are high melting point materials, are less reactive with Sn.

Silicon carbide (SiC), silicon nitride (SiN), aluminum oxide ($Al_2O_3$), zirconium oxide ($ZrO_2$), graphite, diamond, silicon oxide ($SiO_x$), and molybdenum oxide ($MoO_x$) are also less reactive with molten Sn. Further, tungsten oxide ($WO_3$) and tantalum oxide ($Ta_2O_5$) are also less reactive with molten Sn.

Based on the above, at least one of silicon carbide (SiC), silicon nitride (SiN), aluminum oxide ($Al_2O_3$), zirconium oxide ($ZrO_2$), graphite, diamond, silicon oxide ($SiO_x$), molybdenum oxide ($MoO_x$), tungsten oxide ($WO_3$), and tantalum oxide ($Ta_2O_5$) may preferably be used as the material of the coating 803 and the plate member 802. Alternatively, a material containing one or more of these materials may be used as the material of the coating 803 and the plate member 802.

From the viewpoint of low sputtering rate by the debris, carbon (C) may be used as the material of the coating 803 and the plate member 802.

Tenth Embodiment

A tenth embodiment will now be described in detail with reference to the drawings. In the tenth embodiment, the material having low wettability shown in the ninth embodiment will be used in the debris collection unit 816 of the eighth embodiment. Further, in the tenth embodiment, the temperature of the debris collection unit may be controlled by a combination of a heater and a cooler.

Figure 20A:
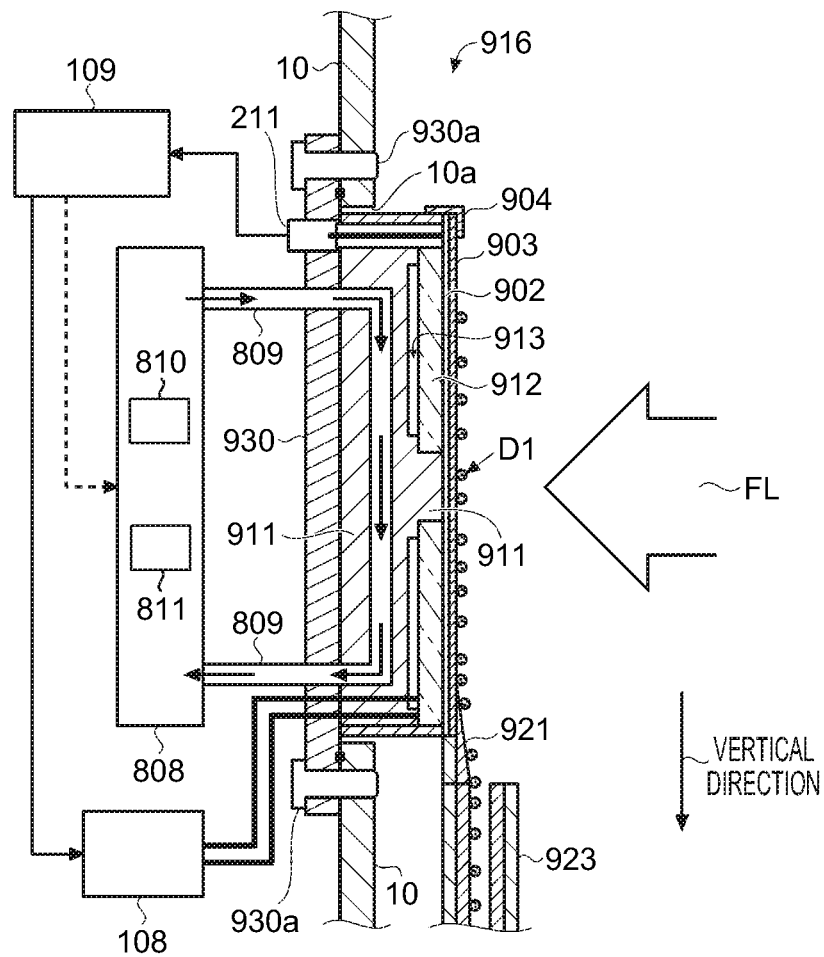
FIG. 20A is a sectional view schematically illustrating an example of the configuration of a debris collection unit according to a tenth embodiment, taken along a plane containing the axis of electromagnetic coils.
Figure 20B:
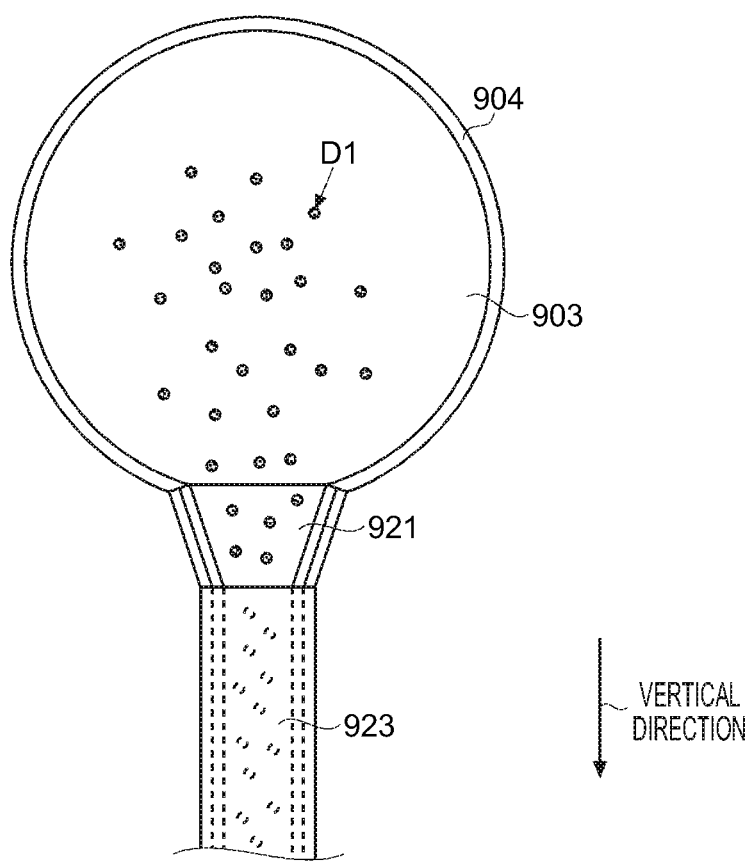
FIG. 20B schematically illustrates the example of the configuration of the debris collection unit shown in FIG. 20A, as viewed in the direction in which an ion flow enters the debris collection unit.
Figure 21:
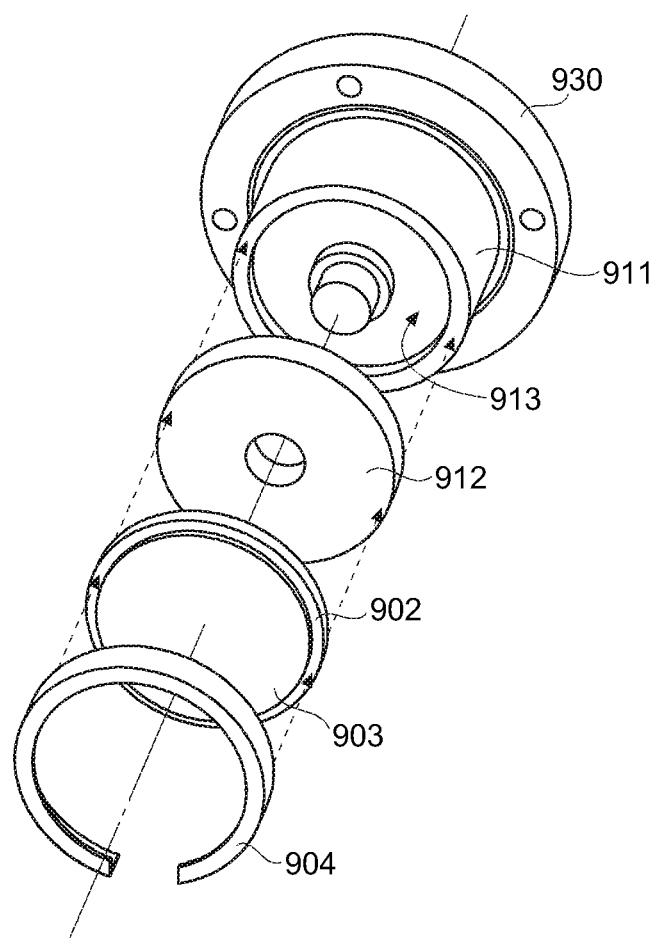
FIG. 21 is an exploded view schematically illustrating the configuration of an assembly at a flange portion shown in FIG. 20A.

FIG. 20A is a sectional view schematically illustrating an example of the configuration of the debris collection unit along a plane containing the axis of the electromagnetic coils. FIG. 20B schematically illustrates the example of the configuration of the debris collection unit shown in FIG. 20A, as viewed in the direction in which an ion flow enters the debris collection unit. FIG. 21 is an exploded view schematically illustrating the configuration of an assembly at a flange portion shown in FIG. 20A.

As shown in FIGS. 20A and 20B, a debris collection unit 916 of the tenth embodiment may include a substrate 902, a heat sink 911, the temperature controller 109, the temperature sensor 211, a heater 912, the power supply 108, the cooler 808, the pipe 809, a receiving portion 921, and a drain pipe 923.

The substrate 902 may be formed of a material having high thermal conductivity. Such a material may, for example, be a metal material, such as copper (Cu), or a ceramic material, such as silicon carbide (SiC). The substrate 902 may be coated with a coating 903 on the surface thereof. When the substrate 902 is formed of Cu, the substrate 902 may be coated with the coating 903 that includes nickel. Alternatively, as in the coating 803 described above, the coating 903 may be formed of a material having low wettability with the target material (e.g., Sn). In that case, the coating 903 may preferably be formed of a material that excels in anti-sputtering properties. The material of the coating 903 may be SiC, carbon graphite (C), or the like. Preferably, an unpolished CVD-SiC film may be used as the coating 903.

Further, as shown in FIG. 21, the heater 912, the heat sink 911, and a flange 930 may be provided on the rear surface side of the substrate 902 in this order from the side closer to the substrate 902. The heat sink 911 and the flange 930 may be formed integrally as shown in FIG. 21, or may be formed separately as shown in FIG. 20A. The substrate 902 and the heater 912 may be fixed to the heat sink 911 using a fixing ring 904 that is engageable with the periphery of the substrate 902. The heat sink 911 may be fixed using the fixing ring 904 and through thread fastening, brazing, welding, or the like.

The heater 912 may be annular in shape. The heater 912 may be ceramics manufactured through a vacuum pyrolysis CVD method. This ceramics may have such a configuration that pyrolytic boron nitride and pyrolytic graphite are laminated, for example.

A space 913 may be defined between the heat sink 911 and the heater 912. The heat sink 911 may be in contact with the heater 912 at least at either the outer circumference or the inner circumference of the heater 912. The space 913 may be filled with a gas, such as an inert gas or the air, at predetermined pressure in order to regulate the thermal conduction between the heat sink 911 and the heater 912. Alternatively, the space 913 may be filled with a liquid or solid material having lower thermal conductivity than the heat sink 911.

Further, as shown in FIG. 20A, the pipe 809 serving as a cooling medium flow channel connected to the cooler 808 may be connected to a cooling medium flow channel inside the heat sink 911. The flange 930 may preferably be operably attached to the chamber 10. The flange 930 and the chamber 10 may be connected to each other through bolts 930a or the like. The chamber 10 may have an opening 10a formed therein for mounting the debris collection unit 916 from the outside of the chamber 10. In that case, the flange 930 can preferably seal the opening 10a airtightly.

The temperature sensor 211 may be configured to detect the temperature of the surface of the substrate 902. The temperature sensor 211 may be provided so as not to be in contact with the heat sink 911. The temperature detected by the temperature sensor 211 may be inputted to the temperature controller 109. The temperature controller 109 may then control the cooler 808 and the power supply 108 based on the temperature inputted from the temperature sensor 211.

The ion flow FL entering the substrate 902 may be deactivated and cohered to thereby be turned into the liquid debris D1. The liquid debris D1 may adhere in a liquid state onto the surface of the coating 903 that has low wettability with the debris D1. The debris D1 may flow downwardly in the vertical direction along the surface of the temperature-controlled coating 903. The debris D1 flowing downwardly in the vertical direction may flow into the drain pipe 923 through the receiving portion 921. The debris D1 that has flowed through the drain pipe 923 may be stored in the collection container 610 (see FIGS. 19A and 19B), for example. The receiving portion 921 and the drain pipe 923 may be heated to a temperature equal to or higher than the melting point of the debris D1 by a heater or the like.

The operation of the debris collection unit 916 will now be described. The cooler 808 may be configured to cause a predetermined amount of the cooling medium to flow in the pipe 809 in the heat sink 911. The cooler 808 may, for example, include a heat exchanger, such as a radiator, and a pressure-feed device, such as a pump. The cooling medium may be cooled silicon oil, organic compound liquid, water, or the like. The heater 912 may include a heat-emitting part (not separately shown). The temperature controller 109 may be configured to control the electric current supplied from the power supply 108 to the heat-emitting part of the heater 912 based on the temperature detected by the temperature sensor 211. With this configuration, the heater 912 may heat the substrate 902 to a temperature within a desired temperature range. The temperature set in the temperature controller 109 may be a temperature equal to or higher than the melting point of the target material (e.g., Sn) at the surface of the coating 903.

In the tenth embodiment, a material having relatively low wettability with the target material may be used as the material of the coating 903. Accordingly, by controlling the temperature of the surface of the coating 903 to a temperature equal to or higher than the melting point of the target material, the debris D1 adhered to the surface of the coating 903 may be dropped in the vertical direction in the form of droplets. The debris D1 may then flow in the drain pipe 923 through the funnel shaped receiving portion 921, and thereafter be stored in the collection container 610 (see FIGS. 19A and 19B).

According to the tenth embodiment, the temperature of the surface of the coating 903 in the debris collection unit 916 may be controlled to a temperature higher than the melting point of the target material. The temperature of at least the surface of the coating 903 may be controlled to a temperature higher than the melting point of the target material even when the EUV light generation apparatus 1 is started initially or when the operation state is changed (e.g., when the duty ratio is changed). Accordingly, the target material may be prevented from being solidified and accumulating on the surface of the debris collection unit 916. Further, since the space 913 is defined between the heater 912 and the heat sink 911, the direct contact area between the heater 912 and the heat sink 911 may be kept small. With this arrangement, thermal conduction may be controlled. With such a configuration, even when a cooling medium having a lower boiling point than the temperature set in the temperature controller 109 is used, the cooling medium may be prevented from boiling. As a result, inexpensive water may be used as the cooling medium.

In the tenth embodiment, the electric current supplied to the heater 912 from the power supply 108 may be kept constant. Instead, the flow rate of the cooling medium may be controlled, whereby the temperature of the surface of the coating 903 may be controlled. In that case, a control valve may be provided in the pipe 809 to control the flow rate of the cooling medium. The temperature controller 109 may be configured to control the control valve provided in the pipe 809 in order to control the temperature of the surface of the coating 903 to fall within a predetermined temperature range (e.g., at or above the melting point of the target material). Alternatively, in place of controlling the control valve, the temperature controller 109 may control the pumping rate of the cooling medium by the pressure-feed device inside the cooler 808.

Alternatively, the temperature controller 109 may be configured to control both the electric current supplied to the heater 912 from the power supply 108 and the flow rate of the cooling medium flowing in the pipe 809 from the cooler 808.

The above-described materials having low wettability with molten Sn may be applied to the debris collection unit in the first through ninth embodiments and the modifications thereof at a part which the debris enters. The part which the debris enters may, for example, include the porous member 102, the mesh member 202, the porous member 402, the porous member 402a, the porous member 402b, the porous member 602, and the porous member 702. Further, the mesh member 303, the porous member 304, the mesh member 511, the mesh member 603, and the porous member 612, each serving as the sputtering prevention part, may also be included as the part which the debris enters.

Eleventh Embodiment

Figure 22:
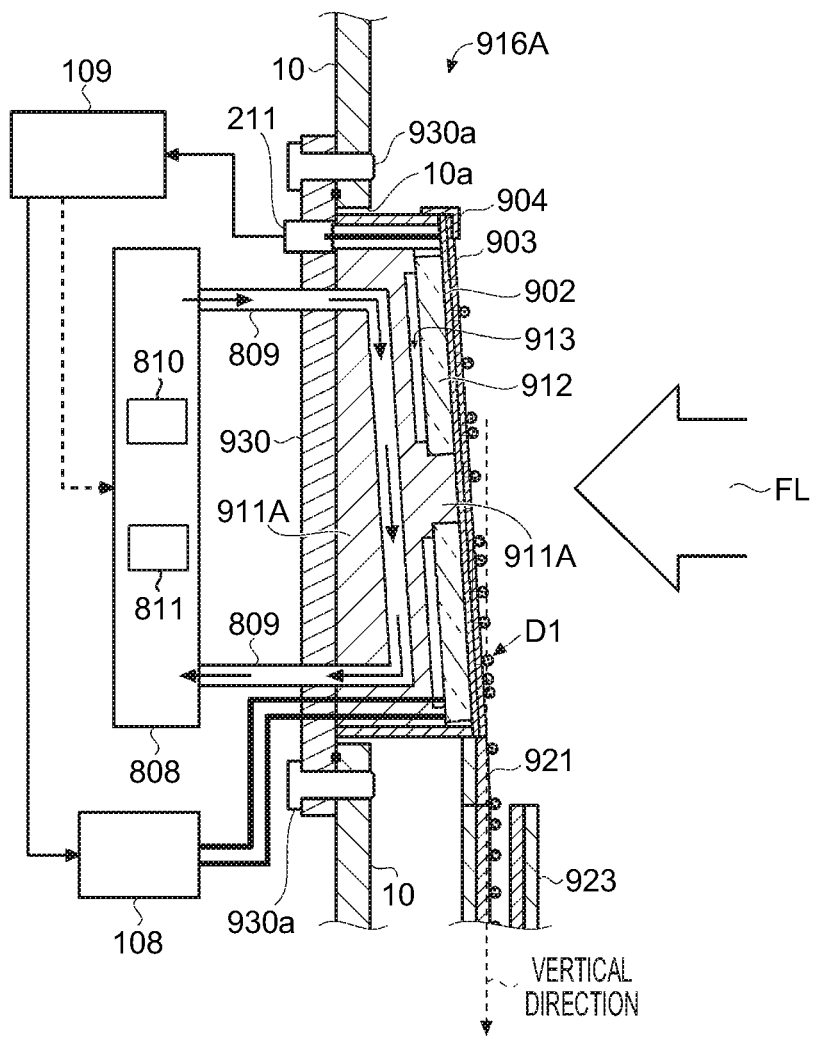
FIG. 22 is a sectional view schematically illustrating the configuration of a debris collection unit according to an eleventh embodiment, taken along a plane containing the axis of electromagnetic coils.

In the above-described embodiments and the modifications thereof, the surface which the ion flow enters may also be slightly inclined with respect to the vertical direction. For example, when a material having low wettability with the target material (Sn) is used on a surface of the debris collection unit 916 (e.g., the substrate 902 or the coating 903), as in the tenth embodiment, the debris collection unit 916 may be positioned such that the surface which the ion flow enters is inclined with respect to the vertical direction. Here, the direction into which the surface is inclined may be such that the surface faces slightly upwardly in the vertical direction. FIG. 22 is a sectional view schematically illustrating an example of the configuration of a debris collection unit according to an eleventh embodiment along a plane containing the axis of the electromagnetic coils.

As shown in FIG. 22, a debris collection unit 916A of the eleventh embodiment may be similar in configuration to the debris collection unit 916 of the tenth embodiment. However, in the debris collection unit 916A, the heat sink 911 may be replaced by a heat sink 911A.

The heat sink 911A may, for example, be a substantially columnar member. One of the two flat surfaces of this columnar member may be slightly inclined with respect to a plane perpendicular to the rotational axis of the columnar member. The heat sink 911A may be arranged in the chamber 10 in a state where this inclined one surface faces upwardly in the vertical direction. The heater 912 and the substrate 902 including the coating 903 may be provided on this inclined one surface. With this configuration, the surface which the ion flow FL enters (i.e., the substrate 902 or the coating 903) may face slightly upwardly in the vertical direction.

As described above, by positioning the debris collection unit 916A such that the surface which the ion flow FL enters is inclined with respect to the vertical direction, the debris D1 adhered to the surface may flow along the surface in the vertical direction. Accordingly, the debris D1 may be prevented from dropping from a part other than the periphery of the surface. As a result, the possibility for the debris D1 not reaching the receiving portion 921, adhering onto the constituent elements in the chamber 10, or scattering in the chamber 10 may be reduced. Further, since a larger amount of debris D1 may flow into the drain pipe 923 through the receiving portion 921 with this configuration, a larger amount of debris D1 may be collected.

The pipe 809 provided in the heat sink 911A may preferably be arranged so as to be substantially parallel to the surface which the ion flow FL enters. With this configuration, the surface which the ion flow FL enters may be cooled efficiently and effectively.

The above-described embodiments and the modifications thereof are merely examples for implementing this disclosure, and this disclosure is not limited thereto. Making various modifications according to the specifications or the like is within the scope of this disclosure, and other various embodiments are possible within the scope of this disclosure. For example, the modifications illustrated for particular ones of the embodiments can be applied to other embodiments as well (including the other embodiments described herein).

The terms used in this specification and the appended claims should be interpreted as "non-limiting." For example, the terms "include" and "be included" should be interpreted as "including the stated elements but not limited to the stated elements." The term "have" should be interpreted as "having the stated elements but not limited to the stated elements." Further, the modifier "one (a/an)" should be interpreted as at least one or "one or more."

What is claimed is:

1. A chamber apparatus for operating with a laser apparatus, the chamber apparatus comprising:
   a chamber including an inlet through which a laser beam from the laser apparatus enters the chamber;
   a target supply unit configured to supply a target material to a predetermined region inside the chamber;
   a magnetic field generation unit configured to generate a magnetic field across the predetermined region inside the chamber;
   a collection unit including a substrate and configured to collect debris, the debris being generated when the target material is irradiated with the laser beam and entering the substrate by traveling along the magnetic field; and
   a temperature control unit configured to retain a temperature of at least a part of the collection unit within a predetermined temperature range,
   the temperature control unit including
      a cooler including a cooling member and configured to cool the substrate,
      a heater contacting with the substrate and configured to heat the substrate, the heater being sandwiched between the substrate and the cooling member,
      a temperature sensor configured to detect a temperature of the substrate, and
      a controller configured to control at least one of the cooler and the heater based on the temperature detected by the temperature sensor.

2. The chamber apparatus according to claim 1, wherein:
   the cooling member contacts with the heater while forming a space between at least a part of the heater and the cooling member.

3. The chamber apparatus according to claim 2, wherein the cooling medium includes water.

4. The chamber apparatus according to claim 1, wherein:
the cooler is configured to continuously cool the substrate with the cooling medium; and
the controller is configured to control the heater based on the temperature detected by the temperature sensor.

5. The chamber apparatus according to claim 1, wherein:
the heater is configured to continuously heat the substrate by causing an electric current to flow in a heat-emitting part of the heater; and
the controller is configured to control the cooler based on the temperature detected by the temperature sensor.

6. The chamber apparatus according to claim 1, wherein:
the cooler includes:
a supply unit configured to supply the cooling medium,
a pipe through which the cooling medium from the supply unit flows, and
a control valve for controlling a flow rate of the cooling medium flowing in the pipe;
the cooler is configured to cool the collection unit with the cooling medium;
the heater is configured to heat the collection unit by causing the electric current to flow in a heat-emitting part of the heater; and
the controller is configured to control the control valve based on the temperature detected by the temperature sensor.

7. The chamber apparatus according to claim 1, wherein a surface of the substrate which the debris enters is formed of a material that includes at least one of silicon carbide, silicon nitride, aluminum oxide, zirconium oxide, graphite, diamond, silicon oxide, molybdenum oxide, tungsten oxide, tantalum oxide, and carbon.

8. The chamber apparatus according to claim 1, wherein a surface of the substrate which the debris enters is inclined with respect to a direction in which the debris enters.

* * * * *